(12) United States Patent
Zanchi

(10) Patent No.: US 8,384,465 B2
(45) Date of Patent: Feb. 26, 2013

(54) AMPLITUDE-STABILIZED EVEN ORDER PRE-DISTORTION CIRCUIT

(75) Inventor: Alfio Zanchi, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 92 days.

(21) Appl. No.: 12/939,834

(22) Filed: Nov. 4, 2010

(65) Prior Publication Data

US 2011/0304375 A1      Dec. 15, 2011

Related U.S. Application Data

(60) Provisional application No. 61/355,122, filed on Jun. 15, 2010, provisional application No. 61/355,126, filed on Jun. 15, 2010.

(51) Int. Cl.
*H03L 5/00*    (2006.01)
(52) U.S. Cl. ......... 327/306; 327/116; 327/119; 327/307
(58) Field of Classification Search .................. 327/116, 327/119, 306, 307
See application file for complete search history.

(56) References Cited

U.S. PATENT DOCUMENTS

| | | | |
|---|---|---|---|
| 5,744,944 A | 4/1998 | Danstrom | |
| 5,825,321 A | 10/1998 | Park | |
| 6,020,727 A | 2/2000 | Bernard et al. | |
| 6,031,363 A | 2/2000 | Danstrom et al. | |
| 6,046,577 A | 4/2000 | Rincon-Mora et al. | |
| 6,268,752 B1 * | 7/2001 | Takahashi et al. | 327/202 |
| 6,362,609 B1 | 3/2002 | Gailhard | |
| 6,465,994 B1 | 10/2002 | Xi | |
| 6,501,253 B2 | 12/2002 | Marty | |
| 6,677,735 B2 | 1/2004 | Xi | |
| 6,677,737 B2 | 1/2004 | Hamon et al. | |
| 6,859,157 B1 | 2/2005 | Gunther | |
| 6,930,622 B2 | 8/2005 | Brede et al. | |
| 6,972,703 B1 | 12/2005 | Yen et al. | |
| 7,095,356 B1 | 8/2006 | Pentakota et al. | |
| 7,151,472 B2 | 12/2006 | Huang et al. | |
| 7,327,166 B2 | 2/2008 | Zanchi et al. | |
| 7,456,619 B2 | 11/2008 | Sasaki et al. | |
| 7,847,530 B2 | 12/2010 | Takagi | |
| 7,907,074 B2 | 3/2011 | Zanchi et al. | |

(Continued)

OTHER PUBLICATIONS

Ahmed M. A. Ali et al., "A 14-bit 125 MS/s IF/RF Sampling Pipelined ADC With 100 dB SFDR and 50 fs Jitter," IEEE Journal of Solid-State Circuits, Aug. 2006, pp. 1846-1855, vol. 41, No. 8.

(Continued)

*Primary Examiner* — John Poos
(74) *Attorney, Agent, or Firm* — William J. Kubida; Peter J. Meza; Hogan Lovells US LLP

(57) ABSTRACT

An amplitude-stabilized second-order predistortion circuit includes a main cell having a differential input for receiving a differential input voltage, a differential output for providing a differential output voltage, and a load control input for receiving a load control voltage; a replica cell having a differential input for receiving a differential level of peak input voltage, a differential peak output voltage, and a load control input; and a control circuit coupled to the differential output of the replica cell and driving the load control inputs of the main cell and the replica cell. The main cell and the replica cell are multiplier cells each having a variable load. The control circuit includes a first amplifier for generating a single-ended peak signal and a second amplifier for generating the load control voltage from the difference between the replica cell single-ended peak output signal and a single-ended peak reference signal.

19 Claims, 31 Drawing Sheets

U.S. PATENT DOCUMENTS

| | | |
|---|---|---|
| 8,106,685 B2 | 1/2012 | Cheng |
| 2006/0082416 A1 | 4/2006 | Marholev |
| 2007/0182399 A1 | 8/2007 | Enjalbert |
| 2009/0224737 A1 | 9/2009 | Lou |
| 2010/0066320 A1 | 3/2010 | Dasgupta et al. |
| 2011/0037507 A1* | 2/2011 | Hwang et al. ............ 327/307 |

OTHER PUBLICATIONS

Alfio Zanchi et al., "A 16-bit 65-MS/s 3.3-V Pipeline ADC Core in SiGe BiCMOS With 78-dB SNR and 180-fs Jitter," IEEE Journal of Solid-State Circuits, Jun. 2005, pp. 1225-1237, vol. 40, No. 6.

Ram Sadhwani et al., "Adaptive CMOS Predistortion Linearizer for Fiber-Optic Links," IEEE Journal of LightwaveTechnology, Dec. 2003, pp. 3180-3193, vol. 21, No. 12.

Barrie Gilbert, "A Precise Four-Quadrant Multiplier with Subnanosecond Response," IEEE Journal of Solid-State Circuits, Dec. 1968, pp. 365-373, vol. SC-3, No. 4.

Barrie Gilbert, "A High-Performance Monolithic Multiplier Using Active Feedback," IEEE Journal of Solid-State Circuits, Dec. 1974, pp. 364-373, vol. SC-9, No. 6.

Evert Seevinck et al., "A Versatile CMOS Linear Transconductor/Square-Law Function Circuit," IEEE Journal of Solid-State Circuits, Jun. 1987, pp. 366-377, vol. SC-22, No. 3.

* cited by examiner

"GILBERT CELL"
MULTIPLIER, AS
A VOLTAGE SQUARER

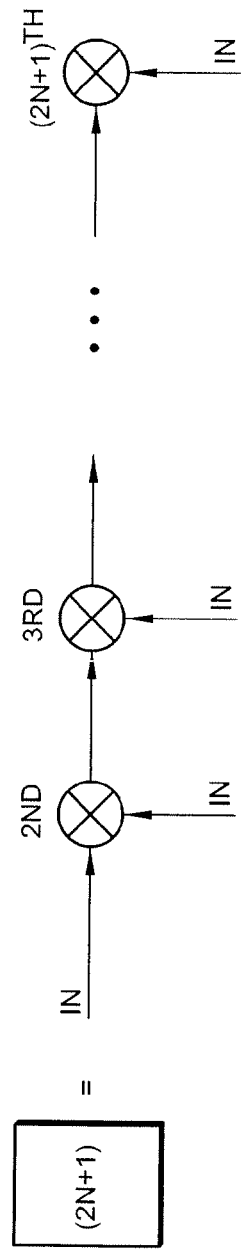
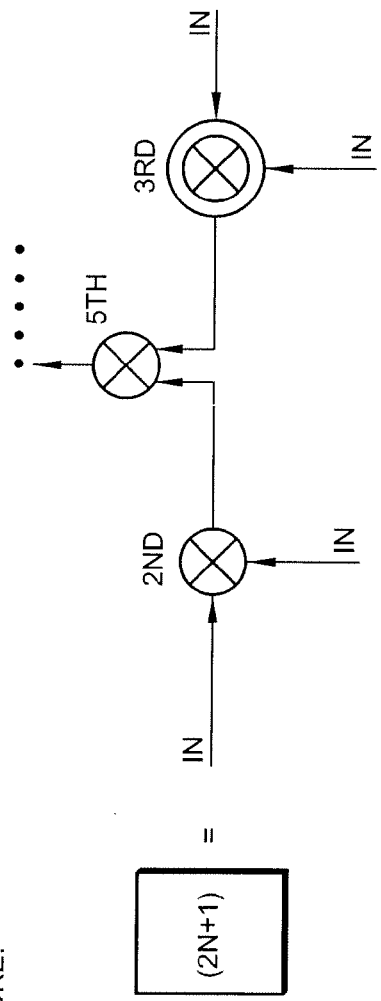
Fig. 30

AMPLITUDE-STABILIZED EVEN ORDER PRE-DISTORTION CIRCUIT

RELATED APPLICATIONS

The present application is related to co-pending application, Ser. No. 12/939,818, entitled, AMPLITUDE-STABILIZED ODD ORDER PRE-DISTORTION CIRCUIT, and claims priority to provisional applications, Ser. No. 61/355,122, and Ser. No. 61/355,126, which are hereby incorporated in their entirety by reference.

BACKGROUND OF THE INVENTION

1. Field of the Invention

This invention relates to pre-distortion circuits for improving the linearity performance of precision analog signal processing circuits such as electro-optical apparata, radio-frequency (RF) transceivers and Analog-to-Digital (A-to-D) converters; and more specifically, to amplitude-stabilized pre-distortion circuits.

2. Discussion of the Related Art

The performance of A-to-D conversion chains (including signal conditioning front-ends, automatic variable gain adjustment VGA, the ADC proper, and other ancillary circuits) is described by a number of electrical parameters, among which a paramount importance is given to distortion. The distortion characteristics of the circuitry are rated in terms of SFDR (Spurious-Free Dynamic Range) or also, and especially in the case of static inputs, by the INL (Integral Non-Linearity). The main harmonic distortion contributors in conversion front-ends apparata are usually the second and third order distortion tone, that can be caused by input non-linear capacitance, non-linear resistance, and more traditional sample/hold and quantizing stage non-linearities such as gain compression. It can be mathematically demonstrated that the gain variation against the output amplitude of an opamp such as 102 shown in FIG. 1, closed in a Sample/Hold feedback loop such as the classic "flip-around" configuration 104 leads to a second-order tone, or a parabolic shape of the INL of the ADC chain.

There are instances (such as in the case of non-linear capacitance) when the input signal frequency plays a major role in dictating the shape of the INL error; in the case of opamp gain modulation, the INL shape tends instead to remain constant against either the input signal frequency, or the clock (sampling signal) frequency. The compensation of the first kind of distortion generally requires a localized circuit solution that counters any C or R modulation by utilizing opposite variations of elements of the same electrical nature. However, INL errors of the second kind, invariant with regards to frequency (and supply, and temperature, and pressure changes, to the largest extent) can be compensated by an ad-hoc circuit, not necessarily related in kind to the cause of the distortion: in fact, the INL distortion can be thought of as a target of the compensation process, regardless of the specific A-to-D conversion block causing the distortion, provided it does not vary substantially with the aforementioned physical variables. Otherwise, some form of "compensation tracking" of the INL error can be devised to minimize the final INL error after compensation in all possible conditions, but—the compensation circuit being unrelated to the original cause of the error—the tracking will most always be approximate, and complicate to a large degree the electrical circuit solution to the original problem.

An additional source of signal harmonic distortion, as added to the parabolic modulation e.g. of an opamp's gain as detailed in a related disclosure, is the so-called "INL S-shape" or third-order distortion shown in FIG. 2. This common signature found in an A-to-D conversion system 202 non-linearity can be generated, e.g., by an intermodulation of the input signal with the voltage reference against which the signal is supposed to be weighted, or by the resistive non-linearity of any MOSFET switches found in a signal path. An all-analog method to correct for the third order distortion generated by this and other mechanisms is desirable. A conceptual correction path 204 and third-order compensation signal is also shown in FIG. 2.

What is desired, therefore, is a pre-distortion circuit that will substantially compensate for second-order and more in general even-order errors, as well as third-order and more in general odd-order errors, for example in an A-to-D conversion chain; and will do so over all process, voltage, and temperature corners, and in presence of radiation.

BRIEF SUMMARY OF THE INVENTION

An amplitude-stabilized second order predistortion circuit includes a main cell having a differential input for receiving a differential input voltage, a differential output for providing a differential output voltage, and a load control input for receiving a load control voltage; a replica cell having a differential input for receiving a differential peak input voltage, a differential output, and a load control input; and a control circuit coupled to the differential output of the replica cell and driving the load control inputs of the main cell and the replica cell. The main cell and the replica cell are multiplier cells each having a variable load. The control circuit includes a first amplifier for generating a single-ended peak signal and a second amplifier for generating the load control voltage from the difference between the first single-ended peak signal and a single-ended reference signal.

The second-order predistortion circuit can be expanded for use as an amplitude-stabilized even-order predistortion circuit including at least a first even-order predistortion circuit having an input for receiving an input signal, an output for providing a correction output signal, and a variable load; and a second even-order predistortion circuit having an input for receiving a peak input signal, an output for providing a correction peak output signal, and a variable load; and a gain and loop stabilization circuit having a first input for receiving the correction peak output signal, a second input for receiving a correction amplitude set point, and an output coupled to the variable load of the first and second even-order predistortion circuits. The first even-order predistortion circuit and the second even-order predistortion circuit can include a cascade of a plurality of multiplier cells or a plurality of multiplier cells coupled according to a binary tree topology for higher even-order error correction as desired.

BRIEF DESCRIPTION OF THE DRAWING FIGURES

The invention, together with its various features and advantages and other aspects, can be readily understood from the following more detailed description taken in conjunction with the accompanying drawing figures, in which:

FIGS. 29 and 30 are block diagrams of a generalized (2N+1) odd-order pre-distortion circuit according to the present invention.

DETAILED DESCRIPTION

According to the present invention, a circuit solution to the problem of compensating for a second-order distortion is described that corrects the distortion effects over an extended temperature range, over all the technological process corners, and in presence of a harsh, radiation-prone environment. The extension of the present invention to third-order distortion, or even and odd higher harmonic orders, is also described below. The solution to the problem of generating a parabolic correction voltage in response to a given input signal level falls in the realm of pre-distortion circuitry, that so far had been used in particular in the domains of telephony and optical signal processing.

According to the present invention, by way of example and not of limitation, a robust quadratic core has been implemented with a double-balanced mixer based on the original concept of the Gilbert cell, that realizes an analog multiplier: when the same signal is fed to both input ports, the output $\mu \cdot (V_{in} \cdot V_{in}) = \mu \cdot V_{in}^2$ returns the wanted quadratic signal, scaled by the multiplier gain. The multiplier cell has been extensively used in prior art, from the early analog computers to the most recent RF-mixing stages, either in bipolar or CMOS technologies.

Figure 1:
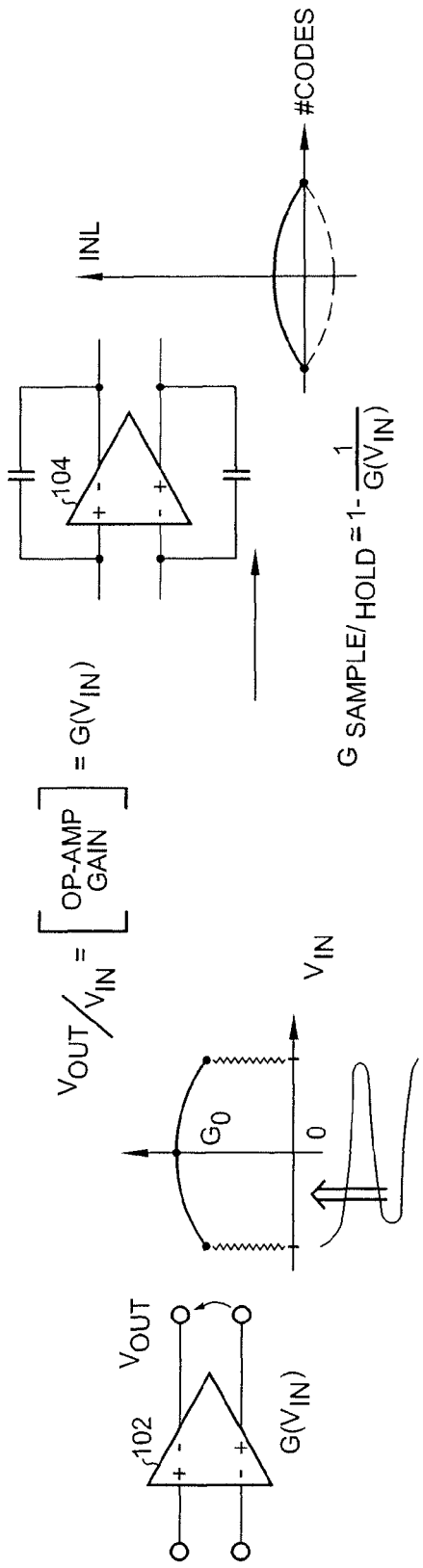
FIG. 1 is an illustration of a parabolic, second-order error associated with, for example, the flip-around Sample/Hold front-end of an A-to-D converter according to the prior art.
Figure 2:
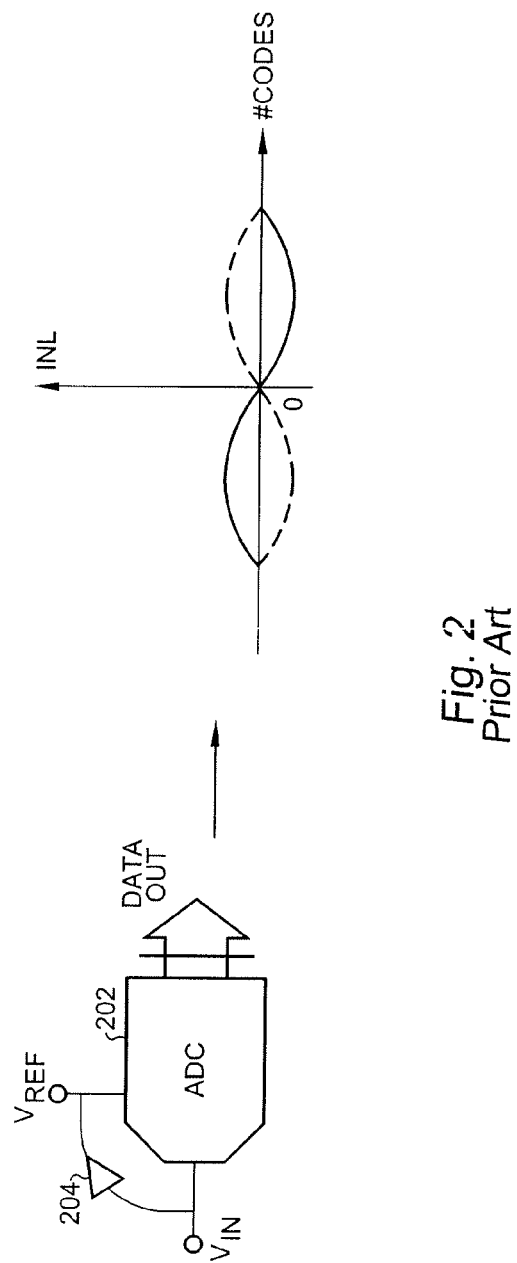
FIG. 2 is an illustration of an "S-shaped", third-order error associated with, for example, an intermodulation between input and voltage reference of an A-to-D converter according to the prior art.
Figure 3:
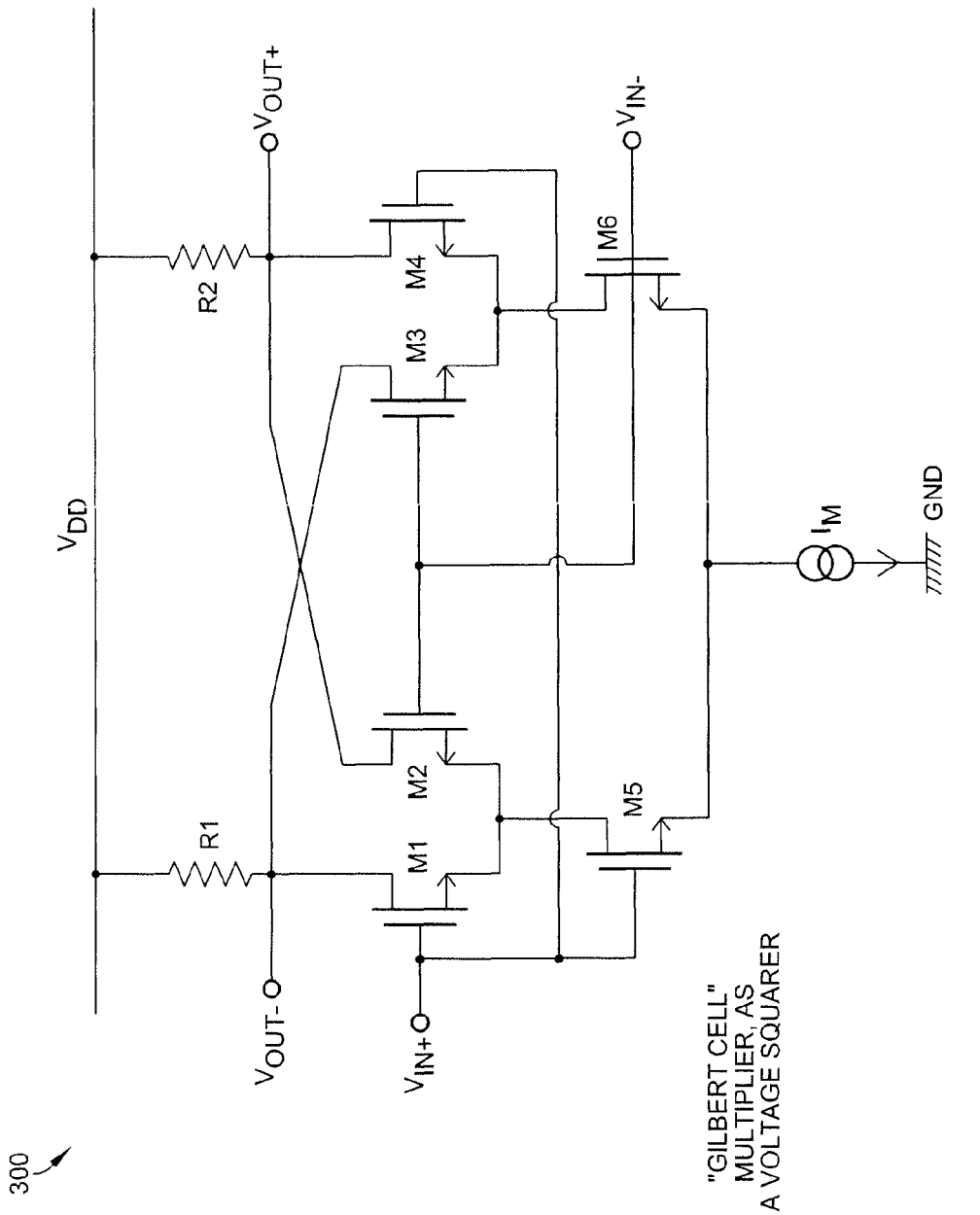
FIG. 3 is a schematic diagram of a "Gilbert Cell" multiplier used as a voltage squarer, which is employed in a circuit embodiment of the present invention.

A "Gilbert Cell" CMOS multiplier 300 is connected to implement a voltage squarer and is shown in FIG. 3. A first differential stage includes transistors M1 and M2. A second differential stage includes transistors M3 and M4. The drains of transistors M1 and M3 are coupled together to resistor R1 to form the $V_{OUT-}$ output. The drains of transistors M2 and M4 are coupled together to resistor R2 to form the $V_{OUT+}$ output. Resistors R1 and R2 are also coupled to the $V_{DD}$ power supply voltage rail. The gates of transistors M1 and M4 are coupled together to form the $V_{IN+}$ input. The gates of transistors M2 and M3 are coupled together to form the $V_{IN-}$ input. A third differential stage modulates the transconductance of the aforementioned first and second differential pairs, effectively implementing the multiplication, and includes transistors M5 and M6. The drain of transistor M5 is coupled to the sources of transistors M1 and M2, and the drain of transistor M6 is coupled to the sources of transistors M3 and M4. The gate of transistor M5 is coupled to the $V_{IN+}$ input, and the gate of transistor M6 is coupled to the $V_{IN-}$ input. The sources of transistors M5 and M6 are coupled to the $I_M$ current source.

Figure 4:
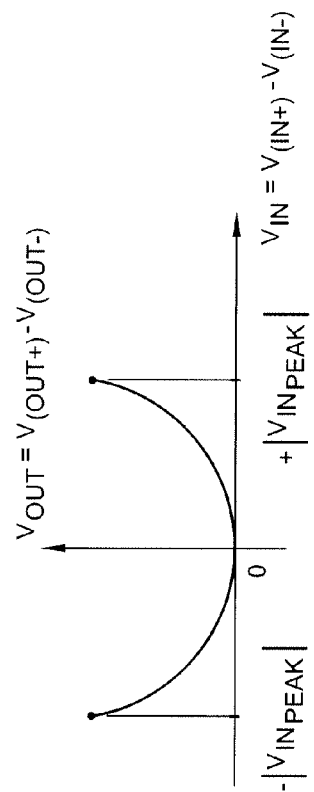
FIG. 4 is a second-order (parabolic) input/output transfer function, wherein a peak voltage thereof is used in a circuit embodiment of the present invention.

Using a Gilbert cell 300 as shown in FIG. 3 for pre-distortion to correct for second-order effects is of limited application, however, if the circuit was applied to an A-to-D chain and left as is, in an open loop. In fact, e.g. the NMOSFET implementation of the Gilbert cell 300 is extremely sensitive to temperature and process corners, and the differential input/output parabolic transfer function shown in FIG. 4 varies by up to 50% when a series of different combinations of temperature and typical/slow/fast corners is applied. It would be desirable to stabilize the transfer function of the core cell, to be added to the A-to-D signal chain to cancel out the second-order distortion, in such a way that a constant INL error is nullified in every condition—otherwise, the Spurious-Free Dynamic Range ("SFDR") improvement attained in one condition (e.g., at trimming time in the factory) will be degraded in different operating conditions. This is especially true for the extended-temperature range (−50° C. to +125° C. junction temperatures) required in aerospace applications; and equally applies to the tighter specifications that such applications demand, over normal commercial ones, with respect to manufacturing variability. According to the present invention, a regulation loop based on a replica distortion cell is described that permits a tight control of the amount of distortion compensation under all operating conditions.

The benefits of a closed-loop implementation of the cell are apparent in simulation. While it is difficult and not convenient to monitor the output of the distortion core cell in presence of a continuously varying input, an identical cell can be placed close to the main cell in layout, so as to share the same general thermal, supply and bias conditions as the controlled core. The replica cell can be driven in fact by a constant input, made identical to the peak value of the input signal; actually, the input signal could be slaved, in amplitude, to the voltage levels driving the replica cell, to augment the reliability of the implementation. The squared-peak output of the replica cell represents the maximum value of the parabolic correction signal that can be produced by the distortion cell: this voltage level therefore can and is to be controlled under the various operating conditions. Rather than realizing the control mechanism via the current bias of the cell, it is the load of the stage that can be better exploited in this circuitry. In fact, since the mixing action of the NMOSFET Gilbert cell depends on the $g_m$ of the top pair being modulated by the current as it is modulated by the bottom pair, in a $g_m(I_{bias})$ fashion, it is apparent how the mixing gain $\mu$ will be affected by modulations of $I_{bias}$, albeit in a $\sqrt{Ibias}$ fashion for saturated devices. To counter the strong variations of $\mu$ versus the temperature, major, and highly non-linear, compensation of $I_{bias}$ is in order e.g. when Temp=(−50° C., +150° C.), which puts the operating range and the parabolic correction shape itself in jeopardy. This mainly derives from the weak, non-linear $I_{bias} \rightarrow V_{OUT}$ dependency, that however also impacts to a great extent the cell's transfer function itself.

Instead, it is advantageous to control the resistive load of the cell, which reflects linearly over the $V_{OUT}$ amplitude and leaves the inherent transfer function of the distortion cell unaltered. The amplitude of the replica cell output can be compared against the desired amount of pre-distortion correction to be injected into the ADC chain; and the resulting error can be used to adjust the load value until the peak amplitude output of the replica cell (and, of course, the signal amplitude output, i.e. the gain of the main core cell) correspond to the desired level. This principle is sketched in the circuit 500 of FIG. 5.

Figure 5:
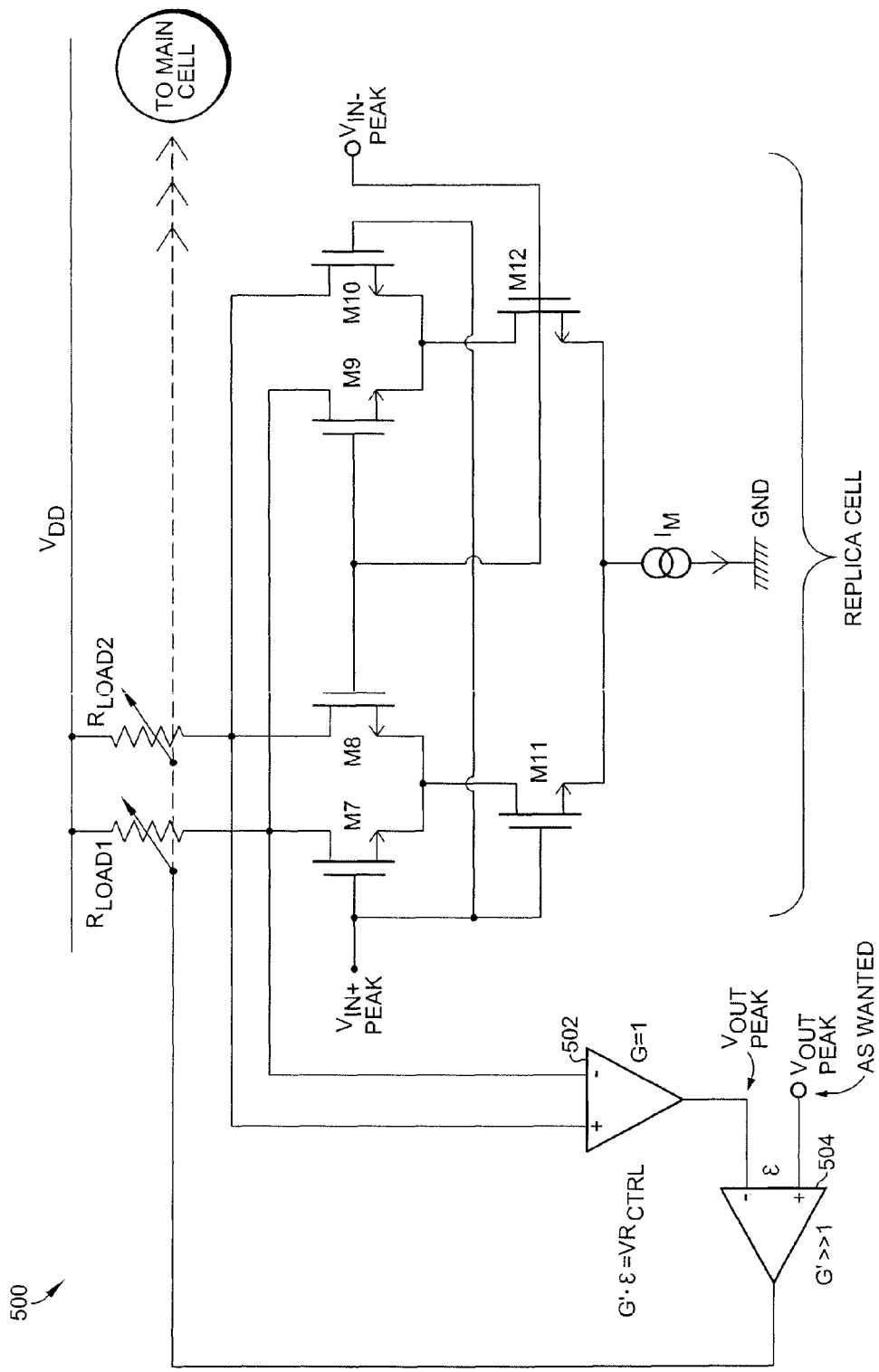
FIG. 5 is a schematic diagram of an even-order replica cell and related gain and loop stabilization circuitry according to an embodiment of the present invention.

Referring now to FIG. 5, it is apparent that a replica Gilbert cell includes transistors M7, M8, M9, M10, M11, and M12, resistors $R_{LOAD1}$, $R_{LOAD2}$, and current source $I_M$ in the same circuit configuration as Gilbert cell 300 shown in FIG. 3 including transistors M1, M2, M3, M4, M5, M6, resistors R1, R2, and current source $I_M$. Note that the resistors $R_{LOAD1}$ and $R_{LOAD2}$ are variable resistors. While any controllable variable resistor may be used, a transistor implementation is described in further detail below. A first input of the replica cell receives the $V_{IN+}$ Peak voltage and a second input of the replica cell receives the $V_{IN-}$ Peak voltage. A first unity gain amplifier 502 has a positive input coupled to a first output of the replica cell, and a negative input coupled to a second output of the replica cell. The actual $V_{OUT}$ Peak voltage is then received by the negative input of a second amplifier 504, whose positive input receives the desired $V_{OUT}$ Peak voltage. The gain of the amplifier 504 is set to be high, much greater than unity gain. The output of amplifier 504 thus provides the $VR_{CTRL}$ voltage control signal for adjusting the value of load resistors $R_{LOAD1}$ and $R_{LOAD2}$, as well as the value of the load resistor in the main cell as will be described in further detail below.

Figure 6:
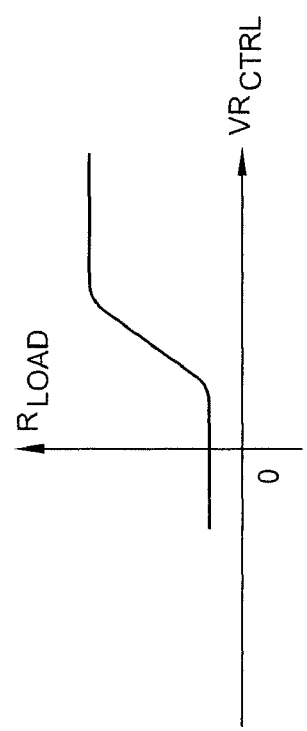
FIG. 6 is a graph of a generic transfer characteristic of a variable load resistor with respect to voltage.

The correct operation of circuit 500 shown in FIG. 5 assumes an increasing, monotonic or saturated, dependence of $R_{load}$ on $VR_{ctrl}$, as shown for example in FIG. 6.

Now $V_{outpeak} = \Delta I_{from\,cell} \cdot R_{load}$ which can be adjusted by the loop, without interfering with the non-linear action (in this case, the squaring) performed on the input peak signal. For $V_{in}=V_{inpeak}$, the main distortion cell will yield exactly the same $V_{out}=V_{outpeak}$ which has been adjusted by the loop on the replica cell, if the feedback signal $VR_{ctrl}$ is fed to identical voltage-controlled loads in both cells. Thus the regulating action of the loop is extended to the replicated original cell, whose output becomes now controlled under any condition.

Figure 7:
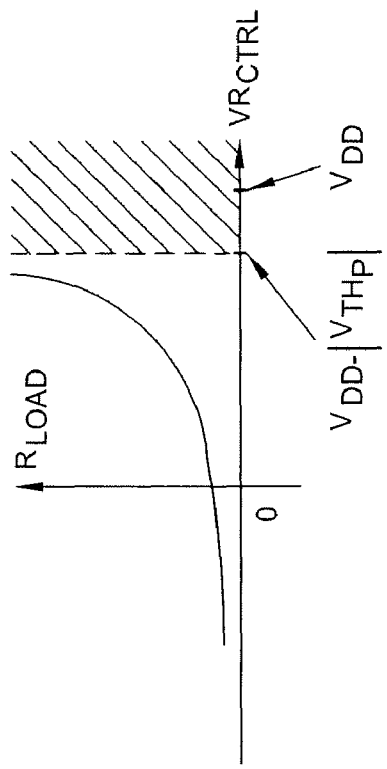
FIG. 7 is a graph of the transfer characteristic of a P-channel MOSFET transistor with respect to voltage.

One additional advantage of the loop tuning scheme according to the present invention resides in the possibility of using a non-linear load characteristic. It has been highlighted that the $V_{out}$ dependency on temperature, as it follows $\mu$(Temp), is very significant: to "compress" the dynamic range of the replica solution, an equally steep $R_{load}(VR_{ctrl})$ dependency can be employed. For example, the $$R_{ON} = \frac{1}{gm} = \frac{L}{W \cdot \mu_P \cdot C_{OX} \cdot (V_{GS} - |V_{TH_p}|)}$$

of a PMOSFET in linear region can be used, which—since $V_{GS}=(VR_{ctrl}-V_{DD})$—can be represented via the curve in FIG. 7.

Major reductions occurring in the parabola's amplitude (such as observed at high temperatures and slow NMOSFET process corner) can be compensated by a relatively modest $\Delta VR_{ctrl}$ in the steep region of the characteristic, i.e. for $VR_{ctrl} \sim (V_{DD}-|V_{THp}|)$; increases in the cells' output amplitude are usually less pronounced, and can usually be handled by lower values of $VR_{ctrl}$. During the design phase, of course the loop shall be stabilized in the higher $G_{loop}$ condition, i.e. when $VR_{ctrl}$ drives the PMOSFET load to approach the subthreshold region of operation; e.g. by compensating the loop with enough capacitance. Notice that the +/− sign of the principal illustration of the loop needs reversed when the $R_{load}$ characteristic is decreasing rather than increasing with $VR_{ctrl}$.

Since the amplitude of the parabolic correction is now slaved to the desired $V_{outpeak}$, that is, to the set-up point of the control loop, not only can it be kept constant (within the limits of the loop operating range, and within $1/G_{loop}$): it can also be trimmed digitally, to increase or decrease the amplitude of the parabolic correction on the A-to-D chain. In principle, the pre-distortion can even be made dependent on temperature or slaved to a critical process corner, should the INL error to be countered present a known dependence upon such variables. In other words, the tight control over the amount of distortion injected can be exploited to refine the INL correction, and extend it to variable-error situations for which a correction was not allowed in prior art.

Figure 8:
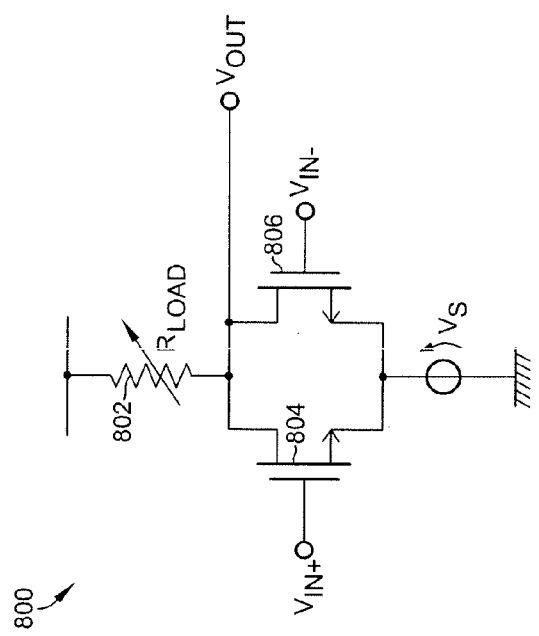
FIG. 8 is a schematic of a common-mode MOSFET-pair circuit used as a quadratic cell.

Notice that the generality of the principle of the "close-loop peak control" allows for usage of a different kind of quadratic cell, such as the basic common-mode MOSFET's cell (FIG. 8) or a number of other cells. Cell 800 shown in FIG. 8 includes a differential pair of transistors 804 and 806, in which the gate of transistor 804 forms the $V_{IN+}$ input and the gate of transistor 806 forms the $V_{IN-}$ input. The sources of transistors 804 and 806 are coupled together to a voltage source $V_S$. The drains of transistors 804 and 806 are also coupled together to variable load resistor $R_{LOAD}$ 802, which forms the $V_{OUT}$ output node with a quadratic sensitivity to the differential input to the pair. Resistor 802 is also coupled to the power supply rail.

Figures 9, 9A:
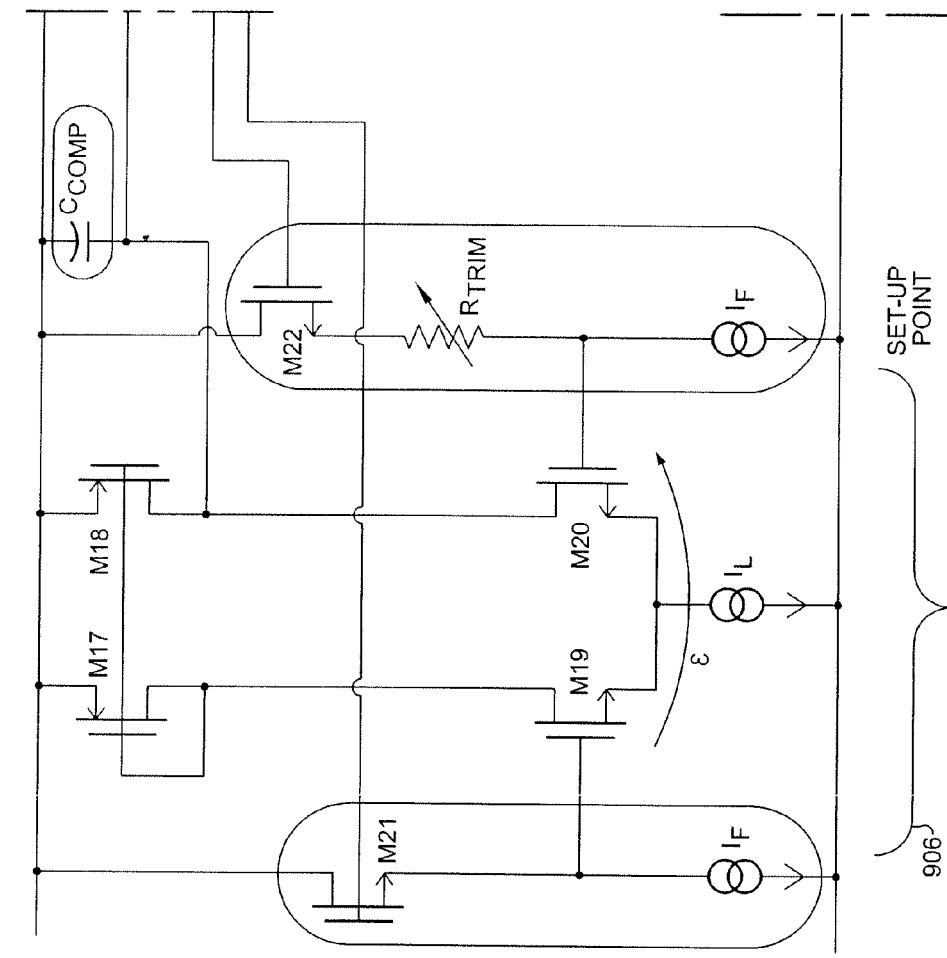
FIG. 9 is a full schematic of an amplitude-stabilized pre-distortion circuit for addressing second-order errors according to an embodiment of the present invention.
Figure 9B:
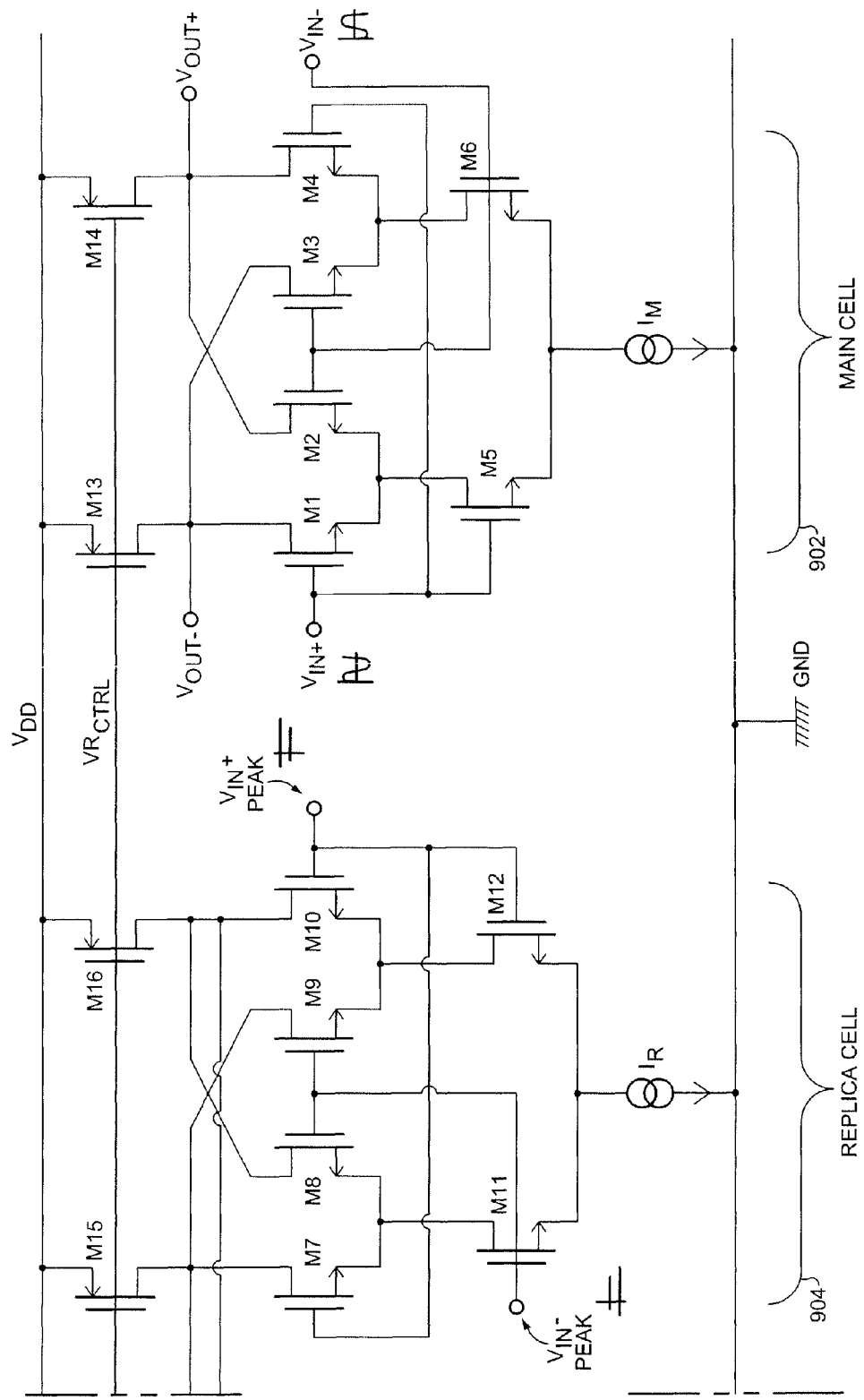

It will be apparent to those skilled in the art that all of the characteristics useful to effect an even-order correction ($2^{nd}$, $4^{th}$, $6^{th}$, and so forth) require pre-distortion shapes of the quadratic kind, whose peaks identify the magnitude of the needed correction even in the paradigm of an INL calculated by using the zero-end corrected algorithm. In other words, for even-order correction curves, the amplitude control loop constitutes the only control parameter needed to execute an optimal cancellation of the HD2, HD4, HD6, HD(2n) distortion harmonic. A complete implementation of the whole solution, including the loop and the reference (or set-point) implementation, can be realized as depicted in FIG. 9 where $R_{temp} \cdot I_F = \Delta V_{peak}$ defines the desired amplitude of the parabola, and can be easily trimmed. An actual hardware implementation for higher order even-order correction is described in further detail below.

Unlike most of the prior art, the present disclosure does not make use of look-up tables (LUTs), FPGAs, or otherwise dedicated digital circuitry. Alternative techniques can be devised to correct for the INL distortion of an A-to-D conversion system based on digital pre-trim of a pipeline ADC stage, but such methods produce a "digitized", discrete-level correction profile that—while it can coarsely compensate for second or third order shapes—will introduce higher-order tones in the transfer function of the component. The present solution instead corrects a continuous-level voltage error with a continuous-level curve, which guarantees the least generation of super-harmonics. Also, unlike complicated methods of estimation and compensation of output tones in a whole transceiver (Rx side, and power-amplifier PA-Tx side), this circuit and method can be applied to a single amplifier, or VGA, or A-to-D converter (ADC) with minimal area and power consumption penalty, also optimizing thermal and power supply tracking of main and replica circuits. Most of the prior art in this field concerns optical networks as opposed to electrical ones, as detailed in the prior art supported herewith.

FIG. 9 shows a more detailed embodiment 900 of the circuit diagram partially shown in FIG. 5. The main cell 902 is substantially as described with reference to transistors M1-M6. However, note that the load resistors have been replaced with P-channel variable-load transistors M13 and M14. The gates of transistors M13 and M14 receive the $VR_{CTRL}$ voltage control signal. The replica cell 904 is substantially as described with reference to transistors M7-M12. However, note that the load resistors have been replaced with P-channel variable-load transistors M15 and M16. The gates of transistors M15 and M16 also receive the $VR_{CTRL}$ voltage control signal. In FIG. 9, the main cell 902 is biased with current source $I_M$ and the replica cell 904 is biased with the $I_R$ current source. The loop gain, shifting, and set-up point circuit 906 corresponds approximately to the circuits shown as amplifiers 502 and 504 in FIG. 5. Circuit 906 includes a differential pair of transistors M19 and M20 biased with the $I_L$ current source. A current mirror including P-channel transistors M17 and M18 is coupled to the drains of transistors M19 and M20. The drains of transistors M18 and M20 are coupled together and to the $C_{COMP}$ capacitor for providing the $VR_{CTRL}$ control voltage signal. Transistor M21 has a drain coupled to the power supply rail, a gate coupled to the drains of transistors M8 and M10, and a source coupled to the gate of transistor M19 biased by a first $I_F$ current source. Transistor M22 has a drain coupled to the power supply rail, a gate coupled to the drains of transistors M7 and M9, and a source coupled to the gate of transistor M19 biased by a second $I_F$ current source. Note however, that a trim resistor $R_{TRIM}$ is coupled between the source of transistor M22 and the second IF current source. Trim resistor $R_{TRIM}$ is used to precisely control the peak amplitude of the wanted parabolic pre-distortion signal at the output of the main cell 902. In fact, when the loop is closed and has stabilized, due to the high gain of stage 906 it will have forced the gates of M19, M20 to be almost identical. Were $R_{TRIM}$ not in place, this would translate into the equalization of the single-ended outputs of the replica cell 904, i.e. a zero differential output imparted by the loop on the pre-distortion cell 900. With the reference ohmic drop $R_{TRIM} \cdot I_F$ in place instead, the loop forces an identical $R_{TRIM} \cdot I_F$ voltage difference across the gates of M21 and M22, precisely setting the desired amplitude of the parabolic correction corresponding to the maximum peak of the input signal ($V_{IN+PEAK} - V_{IN-PEAK}$ at the input of 904 in FIG. 9).

Figure 10:
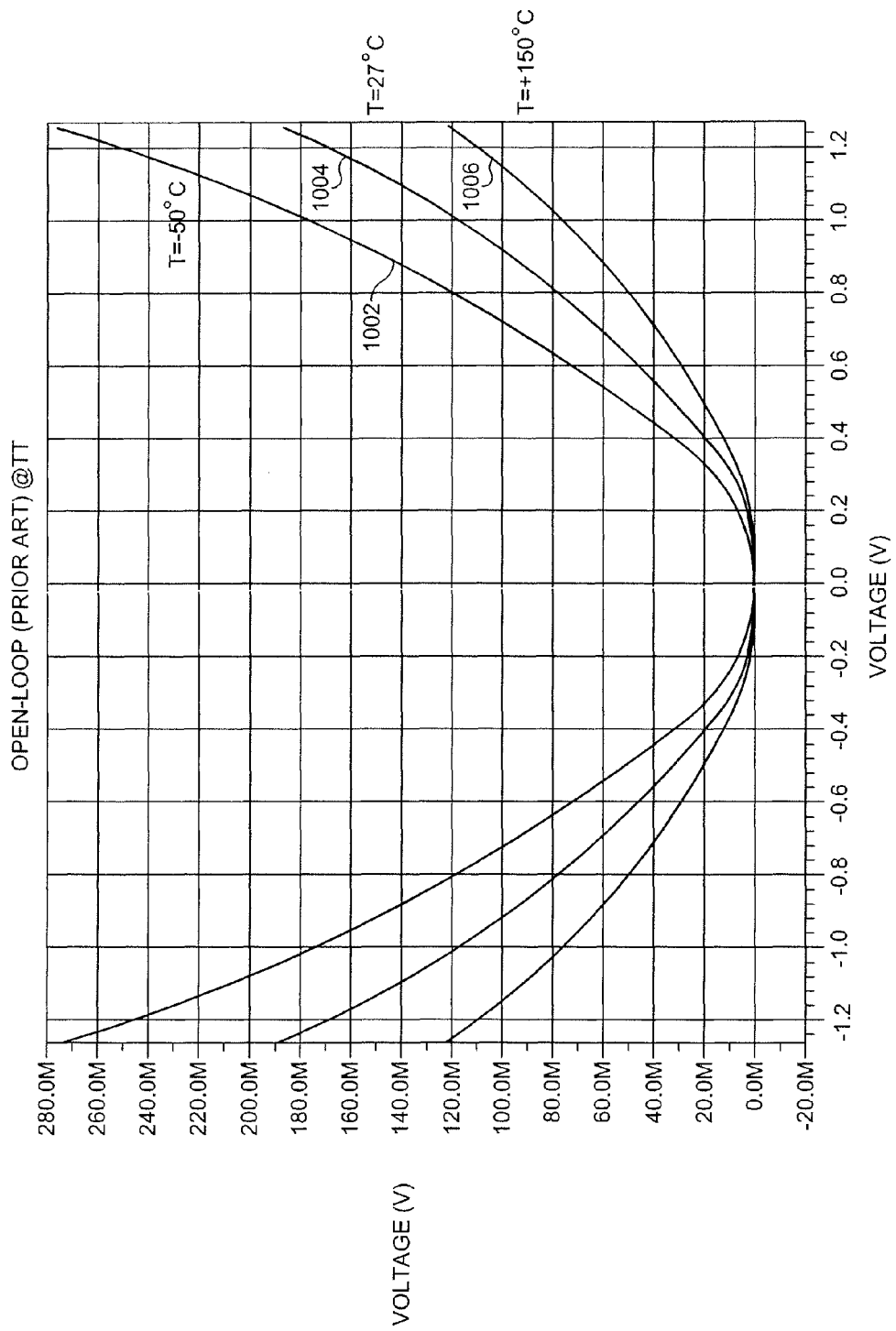
FIGS. 10 and 12 are plots of the open-loop (non-stabilized) performance of a pre-distortion circuit with respect to temperature, and process corners and temperature respectively.
Figure 11:
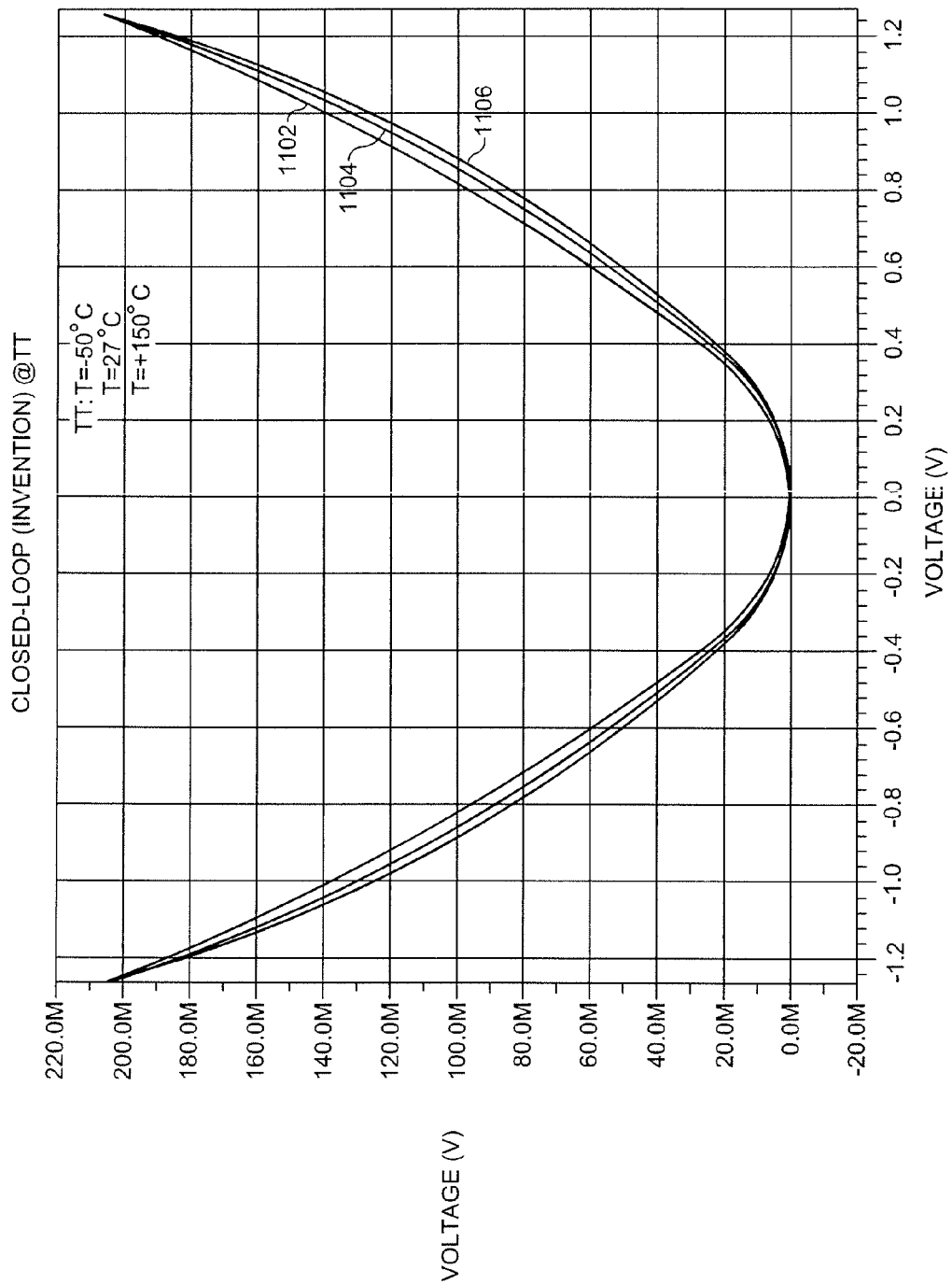
FIGS. 11 and 13 are corresponding plots of the closed-loop (stabilized) performance of a pre-distortion circuit with respect to temperature, and process corners and temperature respectively, according to an embodiment of the present invention.
Figure 12:
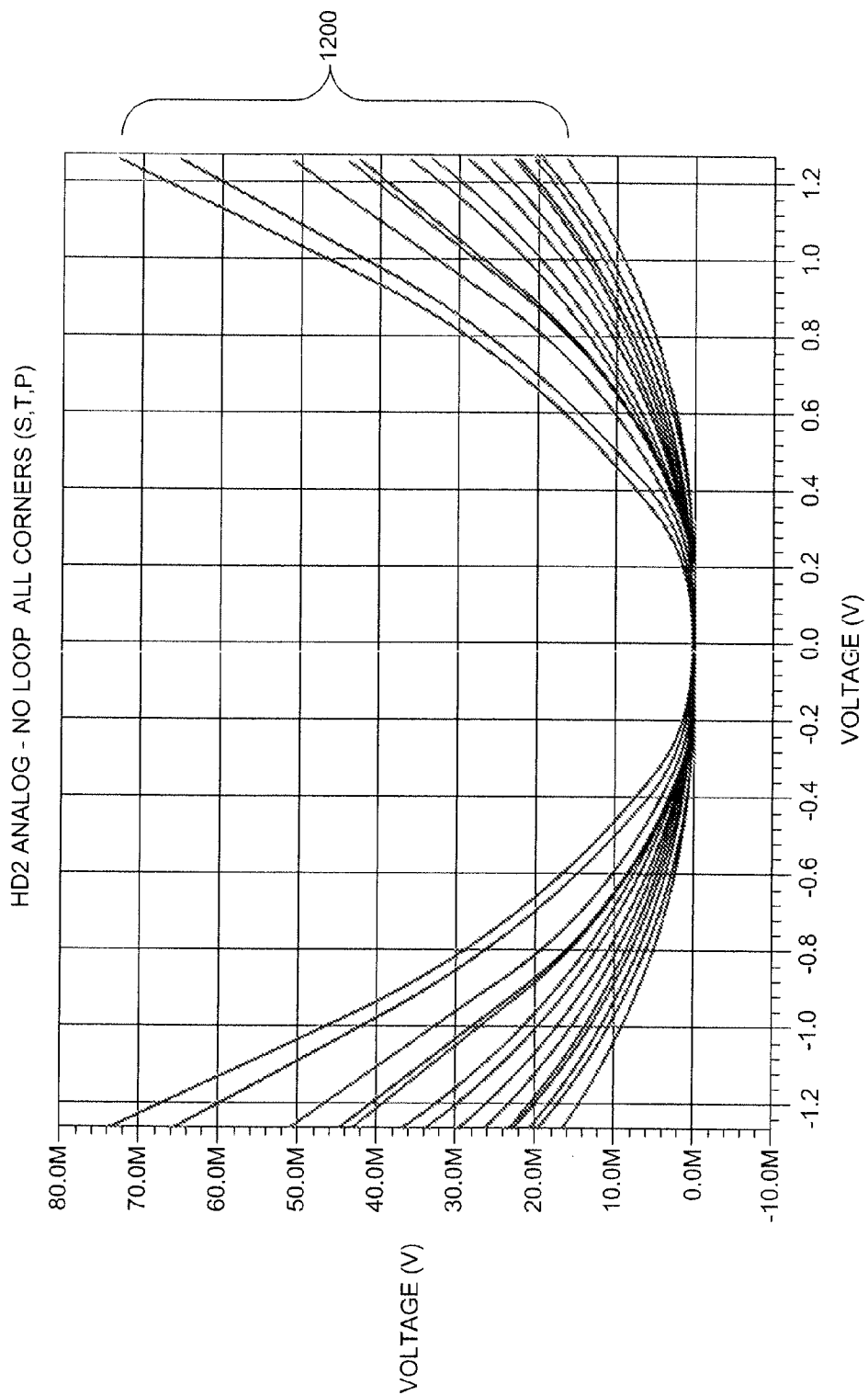
Figure 13:
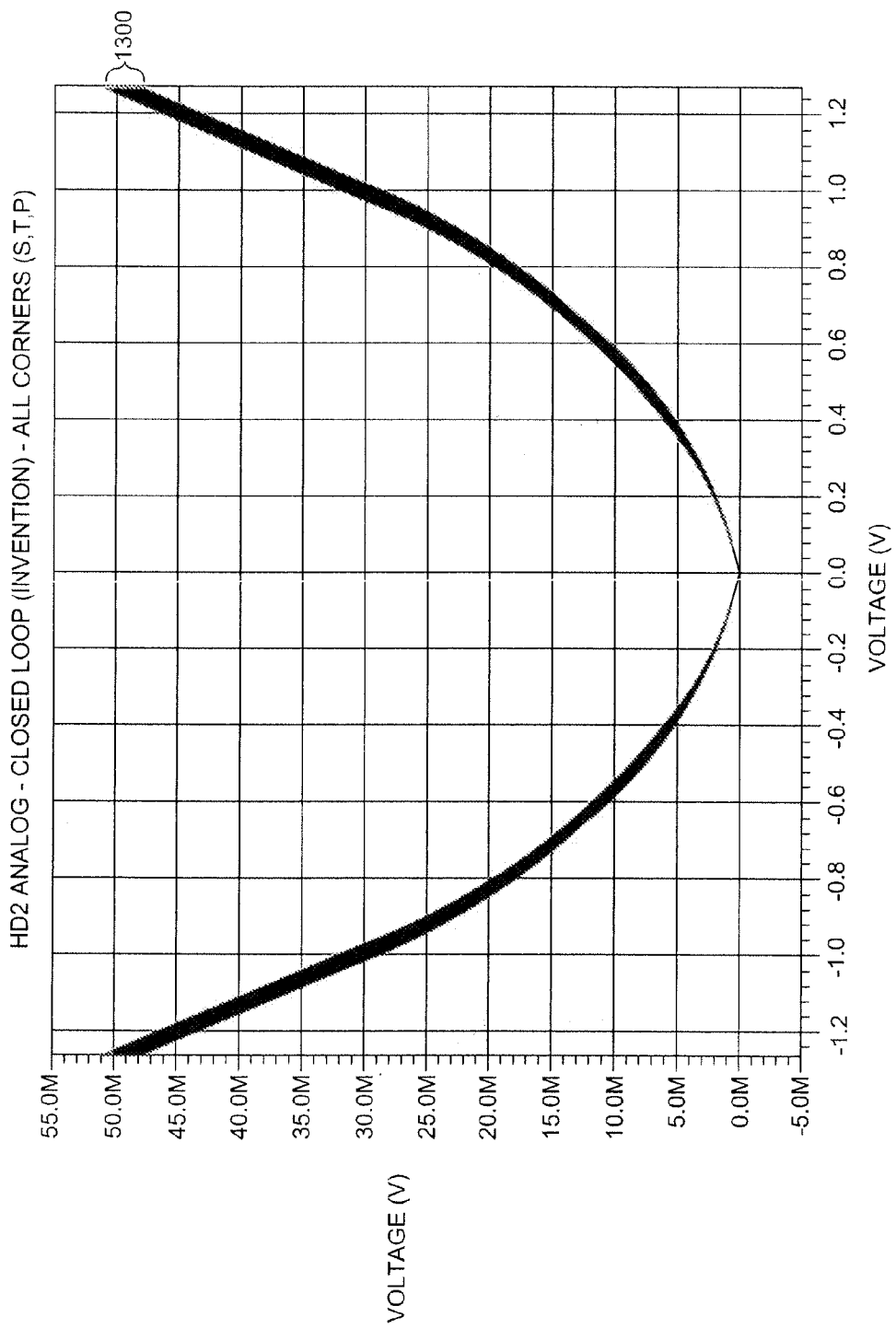

FIGS. 10-13 are simulation graphs that illustrate the improvement in performance that can be realized by implementing the circuit of the present invention. FIG. 10 is a simulation graph of the output voltage vs. input voltage transfer characteristics of an open loop second-order predistortion circuit. Note that the parabolic shape of the transfer curve changes dramatically with temperature. Trace 1002 is the transfer curve simulated at −50° C., trace 1004 is the transfer curve simulated at 27° C., and trace 1006 is the transfer curve simulated at 150° C. FIG. 11 is a simulation graph of the transfer characteristics of a closed loop second-order predistortion circuit according to the present invention. Note that the parabolic shape of the transfer curve now barely changes with temperature. Trace 1102 is the transfer curve simulated at −50° C., trace 1104 is the transfer curve simulated at 27° C., and trace 1106 is the transfer curve simulated at 150° C. Similarly, FIG. 12 is a simulation of the open loop performance at all process, voltage, and temperature corners. Note the wide spread 1200 amongst the simulated transfer curves. Corresponding to FIG. 12, FIG. 13 is a simulation of the closed loop performance at all process, voltage, and temperature corners. Note the relatively narrow spread 1300 now accomplished via the amplitude control amongst all the simulated transfer curves.

The second order error has been addressed according to the present invention in the above description, and now the third order error will also be addressed. If this kind of third order error, depending on its origin, is substantially independent of frequency, supply, temperature, and process corners, it can be compensated by an ad-hoc circuit that generates an identical but opposite correction signal that can be added back to the original signal to linearize the output. The third order correction signal can be produced by using a number of prior art techniques: for example, by using the aforementioned squaring circuit and re-multiplying the output once more by the input signal: $\mu \cdot (V_{in} \cdot V_{in}) \cdot \mu \cdot V_{in} = \mu^2 \cdot V_{in}^3$ to yield a cubic behavior, which is now dependent to even larger extent than a simple parabola on the "mixing factor" $\mu$.

Figure 14:
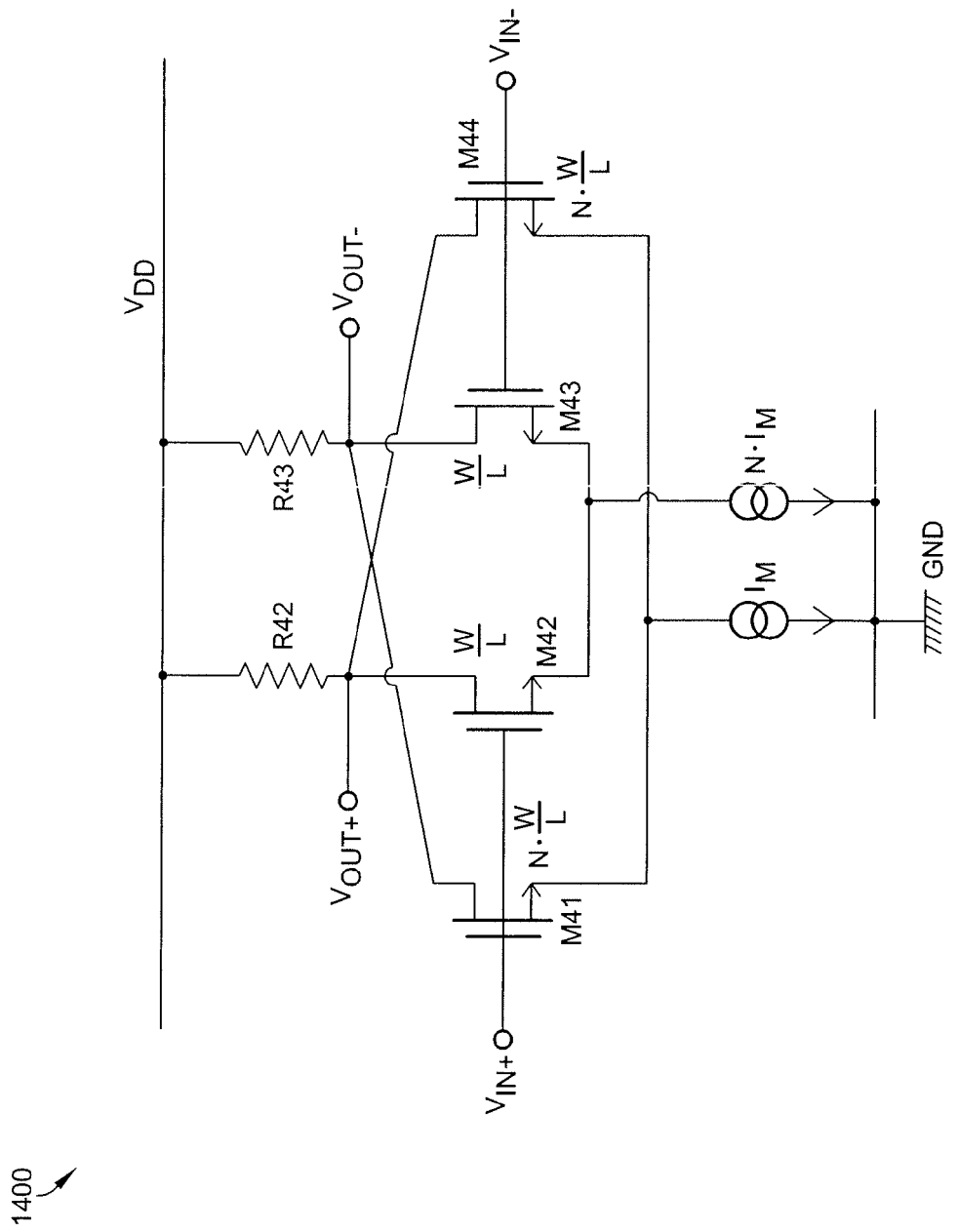
FIG. 14 is a schematic of a cross-coupled differential cell used for providing a third-order compensation signal.

A more compact solution that can be applied to the generation of this signal is instead illustrated in the NMOSFET implementation shown in FIG. 14. A differential cross-coupled cell 1400 includes a first differential pair of transistors M41 and M44. The size of transistors M41 and M44 is each N*(W/L). The drain of transistor M41 is coupled to resistor R43, which forms the $V_{OUT-}$ output node. The drain of transistor M44 is coupled to resistor R42, which forms the $V_{OUT+}$ output node. The gate of transistor M41 receives the $V_{IN+}$ input voltage and the gate of transistor M44 receives the $V_{IN-}$ input voltage. The sources of transistors M41 and M44 are coupled together and receive the $I_M$ bias voltage. The differential cross-coupled cell 1400 also includes a second differential pair of transistors M42 and M43. The size of transistors M42 and M43 is each W/L. The drain of transistor M42 is coupled to resistor R42, and the drain of transistor M43 is coupled to resistor R43. The gate of transistor M42 receives the $V_{IN+}$ input voltage and the gate of transistor M43 receives the $V_{IN-}$ input voltage. The sources of transistors M42 and M43 are coupled together and receive the N*$I_M$ bias voltage.

Figure 15:
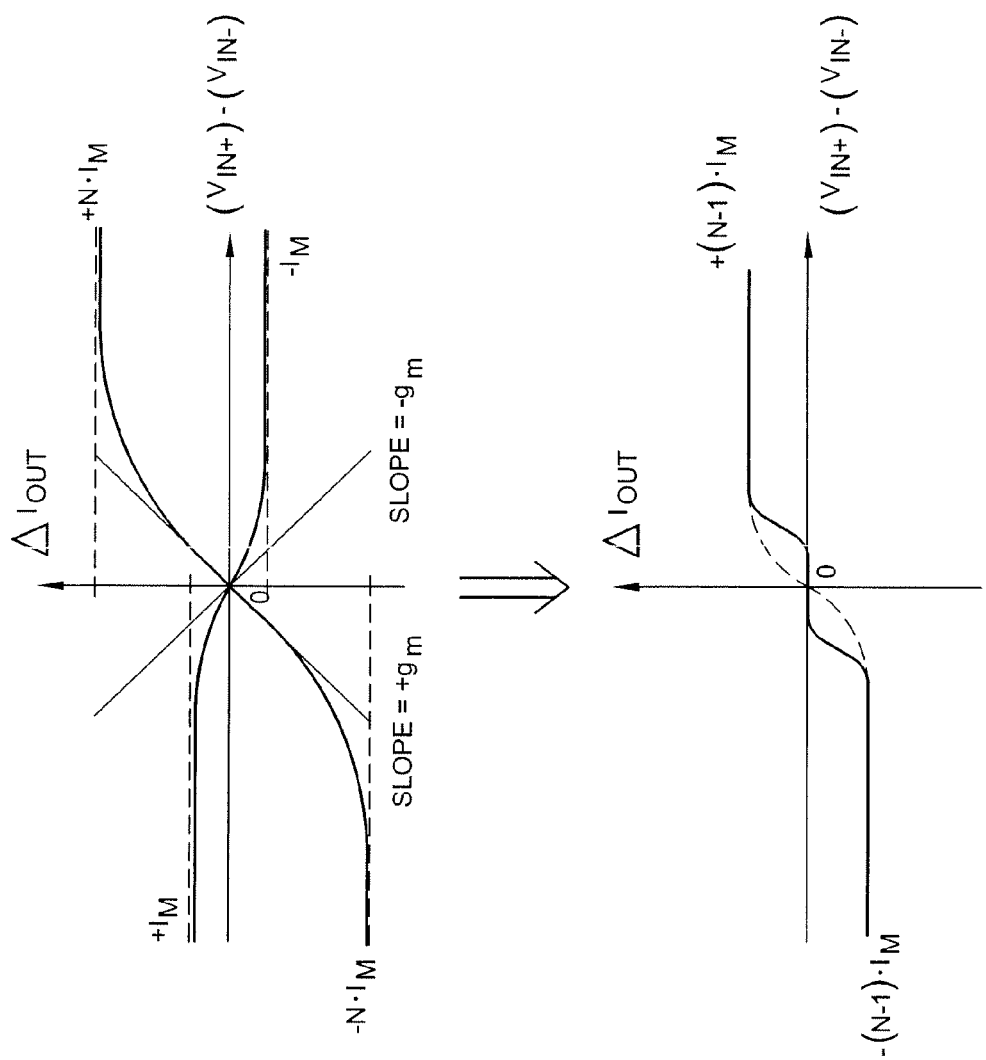
FIG. 15 depicts corresponding transfer function graphs illustrating the voltage input-to-current output odd-order characteristic of the circuit shown in FIG. 14.
Figure 16A:
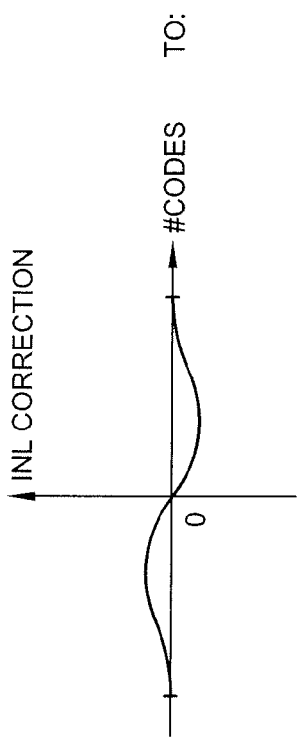
FIGS. 16A and 16B are transfer functions of sub-optimal odd-order INL correction according to the prior art.
Figure 16B:
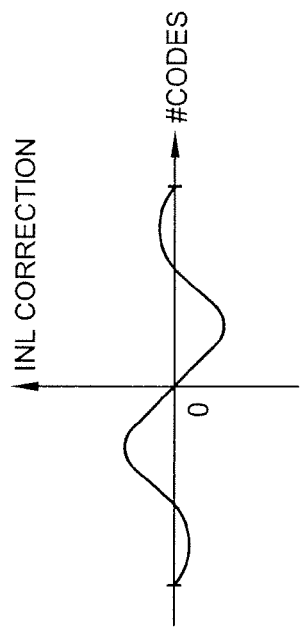

Assuming the NMOSFETs are in saturation, their $g_m \propto \sqrt{W/L \cdot I_D}$, therefore if—as in FIG. 14—a smaller-sized differential pair is biased by a current N-times higher than the current biasing an N-times larger-sized differential pair, their $g_m$ will be substantially identical and given by: $\sqrt{(N \cdot W/L) \cdot I_M} = \sqrt{(W/L) \cdot N \cdot I_M}$ The transfer function of the circuit 1400 of FIG. 14, that differentially subtracts the currents at the output of the differential pairs, will therefore be as in FIG. 15 where, within the odd transfer functions, the first order (linear) term corresponds to the difference of identical $g_m$'s and is thus canceled out, and the third order (cubic) term is the largest term still present. Analogously to the second order harmonic cancellation problem, even though it is desirable to have such a compact circuit 1400 to eliminate a major source of distortion on a continuous-level analog correction basis, the problem remains of the environmental variations affecting the precision of the circuit. Whereas in a parabolic pre-distorter the amplitude of the signal itself did correspond to the amplitude of the parabolic correction, here the magnitude of the third order cubic correction is only indirectly related to the $\Delta I_{out} \rightarrow (V_{out+}) - (V_{out-})$ amplitude. For extended-temperature ranges I.C.'s, for instance specified for a military range of −50° C. to +125° C., leaving the proposed pre-distortion circuit uncontrolled in open loop leads to large variation of the correction term, which changes the amplitude of the correcting term by 100% or more, and even changes the location of the INL corrections's maximum and minimum vs. $V_{in}$. On the other hand, an open-loop attempt at correcting the INL profile, where the $I_M$ bias current was modulated as a means of stabilizing the output correction shape and amplitude, was preliminarily attempted; and it called for a very large variation span of $I_M$ even when the commercial temperature subrange—only (0° C., +80° C.)—was addressed. Since it can be shown that the shape of the cubic correction synthesized by the cell is a strong function of the cell sizing and bias, attempting to tune the pre-distortion amplitude through $I_M$ leads to modify even the shape of the curve, which changes from FIG. 16A to FIG. 16B, This leads to grossly imperfect correction of the non-linearity, and—for very high, and very low, values of $I_M$—eventually tends to engender higher-order harmonic regrowth.

Simulations of the circuit solution according to the present invention prove that a closed-loop control of the signal amplitude at the output of the main pre-distortion cell greatly improves the stability of the compensation curve over temperatures and process corners. Albeit the curve's peaks are not identical nor linearly proportional to the $\Delta V_{out}$ peaks, they are indeed indirectly related to them, and exercising a tight closed-loop control over the $\Delta V_{out}$ curve leads to a much stabilized INL correction curve already.

Figure 17B:
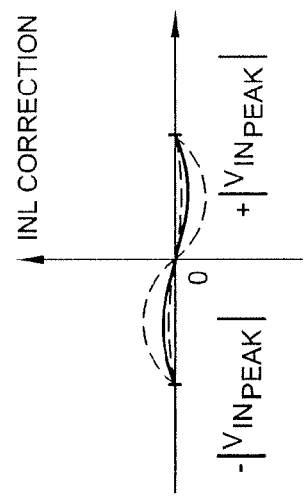
FIGS. 17A and 17B are transfer functions of optimal odd-order INL correction using the peaks of the third-order distortion signal according to the present invention.
Figure 17A:
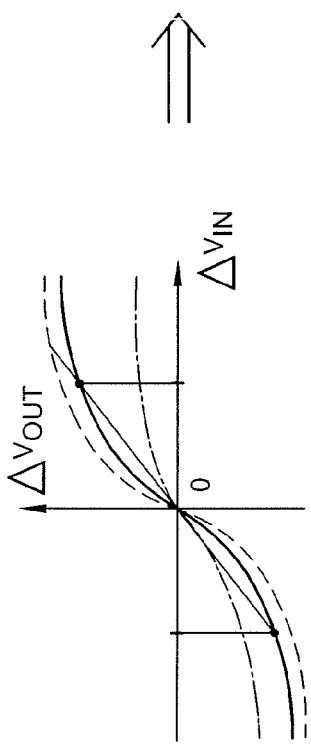
Figure 18:
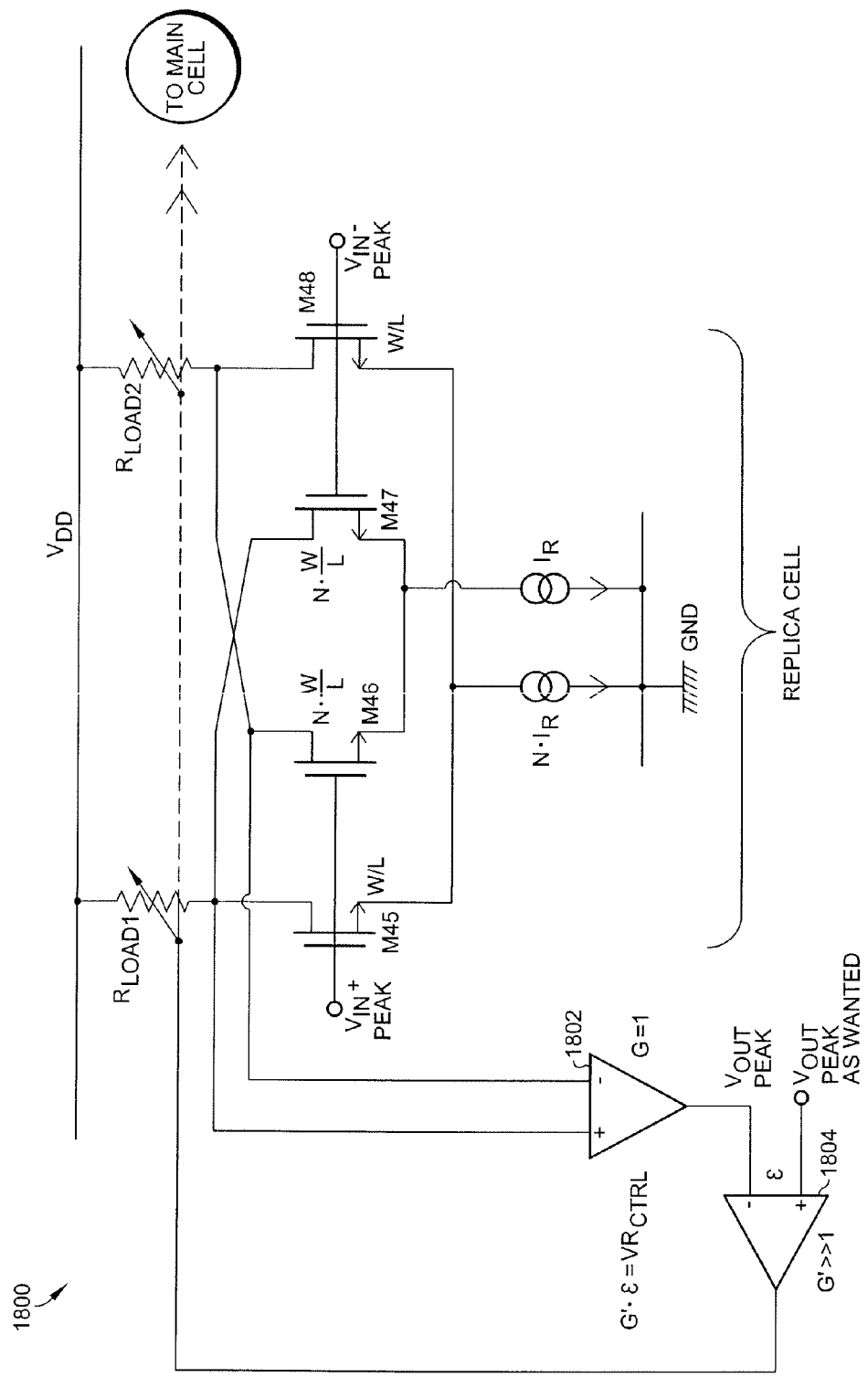
FIG. 18 is a schematic diagram of an odd-order replica cell and related gain and loop stabilization circuitry according to an embodiment of the present invention.

An example of the effects of lack of amplitude control is sketched in FIGS. 17A and 17B. As stated, attempting to control the large variations of the $\Delta V_{out}$ peaks with the weak (and non-linear) leverage offered by tuning $I_M$ leads to pushing the stage out of dynamic range, especially when the environment is harsh and with tight specifications, like in avionics and aerospace context. A direct control over the pre-distortion cell loads proved instead the best choice, and can be exercised over a replica of the distortion cell biased at the peaks of the input range (see FIG. 18). For $V_{in} = V_{outpeak}$, the main distortion cell will yield exactly the same differential $V_{out} = V_{outpeak}$ which is kept constant by the loop, if $VR_{ctrl}$ is fed to identical loads in the main cell as well as in the replica cell. In conclusion, the amplitude of the third order curve synthesized by the main cell is controlled, although indirectly, by the loop; and the only characteristic exercised in FIG. 17 is the solid curve.

Usage of a highly non-linear $R_{load}$, such as a PMOSFET operated in linear region, can be employed to help reduce the range of the control signals that the loop must produce in order to control the large condition variations affecting the main pre-distortion cell. Provided the large variations in $G_{loop}$ are properly compensated by, e.g., a sufficiently large capacitor, such technique also helps to maintain the largest convergence range for the regulation loop.

Referring again to FIG. 18, it is apparent that a replica differential cross-coupled cell includes transistors M45, M46, M47, and M48, resistors $R_{LOAD1}$, $R_{LOAD2}$, and current sources $N^*I_R$ and $I_R$ in the same circuit configuration as differential cross-coupled cell 1400 shown in FIG. 14 including transistors M41, M42, M43, M44, resistors R42, R43, and current sources $I_M$ and $N^*I_M$. Note that the resistors $R_{LOAD1}$ and $R_{LOAD2}$ are now variable resistors. While any controllable variable resistor may be used, a transistor implementation is described in further detail below. A first input of the replica cell receives the $V_{IN+}$ Peak voltage and a second input of the replica cell receives the $V_{IN-}$ Peak voltage. A first unity gain amplifier 1802 has a positive input coupled to a first output of the replica cell, and a negative input coupled to a second output of the replica cell. The actual $V_{OUT}$ Peak voltage is received by the negative input of a second amplifier 1804, whose positive input receives the desired $V_{OUT}$ Peak voltage. The gain of amplifier 1804 is set to be high, much greater than unity gain. The output of amplifier 1804 thus provides the $VR_{CTRL}$ voltage control signal for adjusting the value of load resistors $R_{LOAD1}$ and $R_{LOAD2}$, as well as the value of the load resistor in the main cell as will be described in further detail below.

Figure 19:
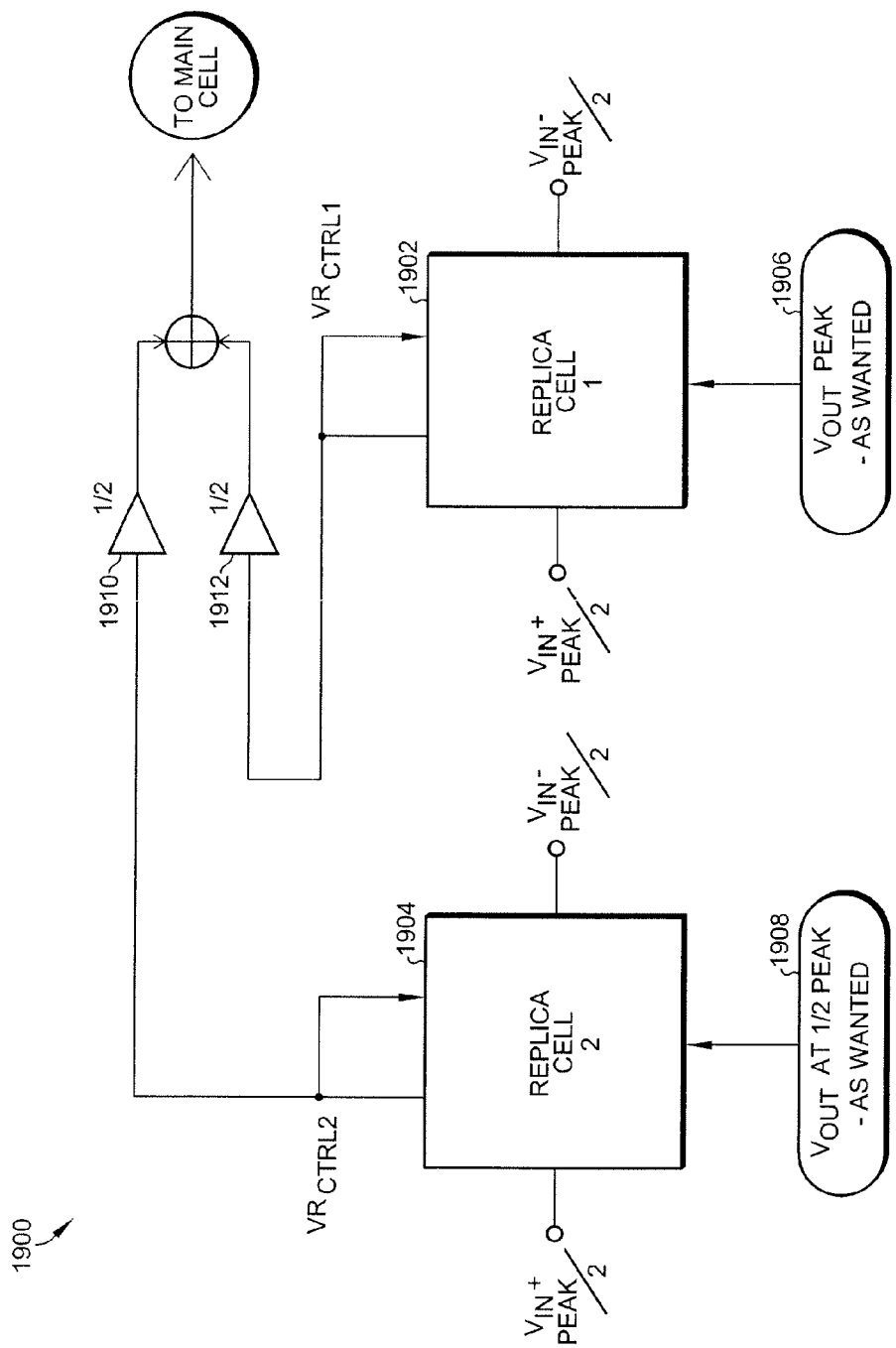
FIG. 19 is a block diagram of replica cells and related gain and loop stabilization circuitries implementing multiple correction loops, to be embedded in an odd-order pre-distortion circuit according to the present invention.

In order to improve the control over the INL correction curve, more than one loop can be envisioned to contribute to the $R_{load}$ control, as shown in FIG. 19. For example, other than controlling the sole maximum amplitude of the $V_{out}$ differential peak, the mid-point of it (at half the $V_{in}$ peak) can be fed to another loop, and the output of the additional loop $VR_{ctrl2}$ can be combined with $VR_{ctrl1}$ with a certain weight. This leads to an optimized shape of the pre-distortion curve that takes into account the various constraints, and produces a curve that satisfies (with certain weights) all of them. In presence of a voltage driver, a simple resistive partition with weighted resistor values suffices to implement the weighted average, which could otherwise be realized with a current summation into a virtual ground or similar analog technique. For example, a circuit 1900 is shown in FIG. 19 according to the present invention including a first replica circuit 1902 fed by $V_{IN+}$ Peak, $V_{IN-}$ Peak, and $V_{OUT}$ Peak (desired) inputs coupled to a first amplifier 1912. A second replica circuit 1904 has ($V_{IN+}$ Peak)/2, ($V_{IN-}$ Peak)/2, and $V_{OUT}$ at Peak/2 (desired) inputs coupled to a second amplifier 1910. The outputs of amplifiers 1910 and 1912 are equally weighted and combined together for controlling the main cell.

Notice that, besides allowing for a correction of the third order curves under every process and temperature condition, the servo-amplitude loop widens the range of operation of the circuit against degradation phenomena due to radiation damage accumulation. With total-dose events accumulating over the circuit, a progressive $V_{TH}$ shift would be engendered in the MOSFETs, that—left in open-loop—quickly leads to the deformation of the INL correction curve, and a subsequent worsening of the overall distortion performance. In a closed-loop configuration, instead, the $V_{TH}$ shift will at most reduce the operational range of the loop, but not hinder its efficacy within such range.

Figures 20, 20A:
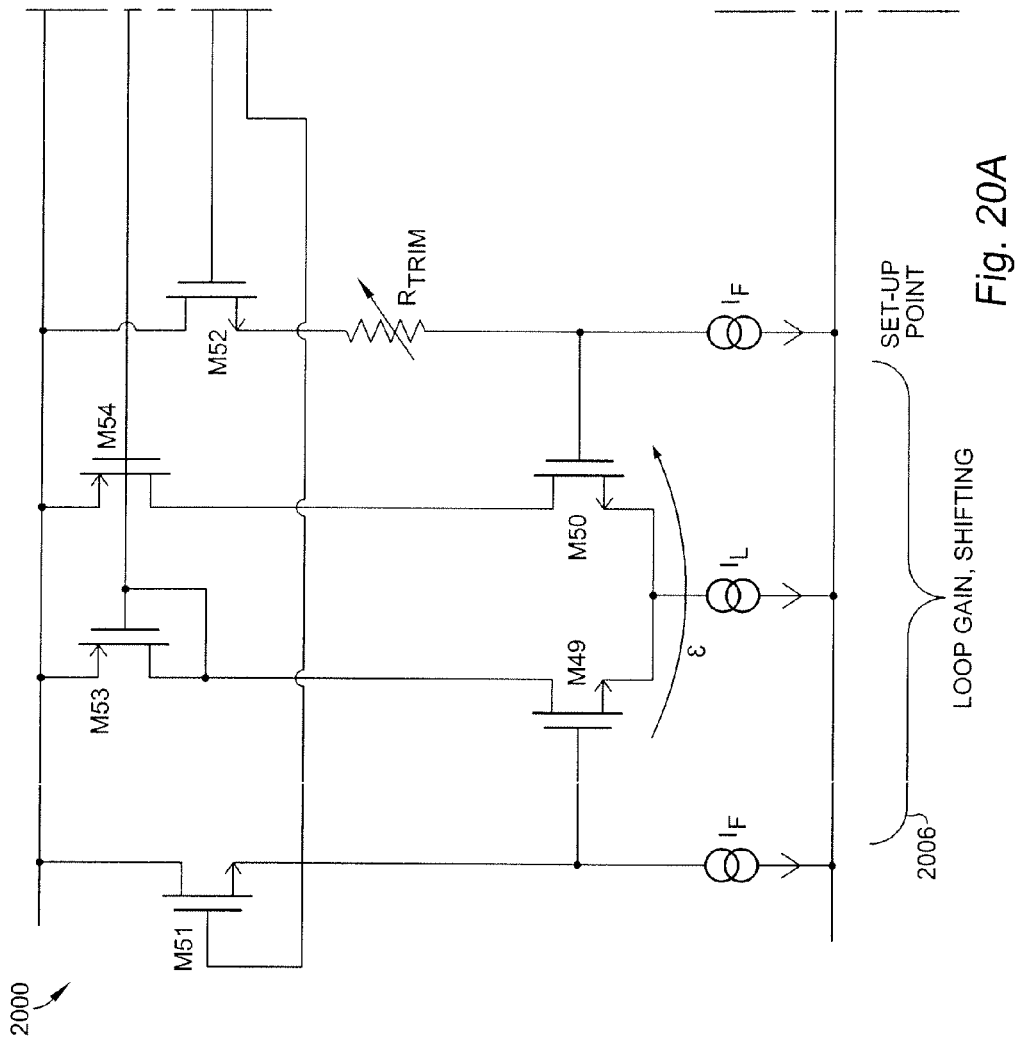
FIG. 20 is a full schematic of an amplitude-stabilized pre-distortion circuit for addressing third-order errors according to an embodiment of the present invention.
Figure 20B:
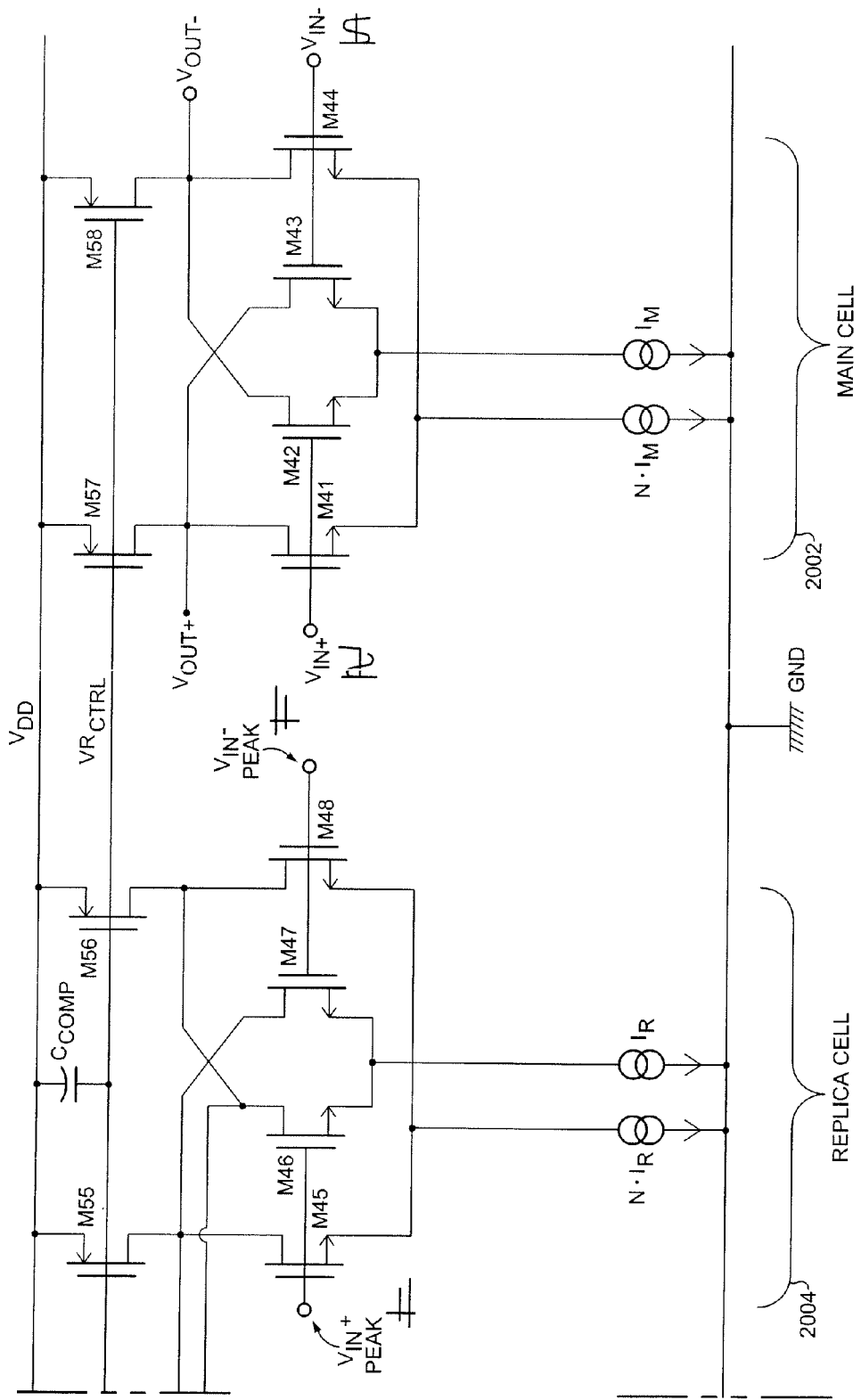

A complete implementation of the whole solution, including the loop implementation in the case of a single control loop acting upon the peak amplitude, can be realized as depicted in FIG. 20. FIG. 20 shows a more detailed embodiment 2000 of the circuit diagram shown in FIG. 18, complete with the main cell and circuit implementation of amplifiers 1802 and 1804. The main cell 2002 is substantially as described with reference to transistors M41-M44. However, note that the load resistors have been replaced with P-channel load transistors M57 and M58. The gates of transistors M57 and M58 receive the $VR_{CTRL}$ voltage control signal. The replica cell 2004 is substantially as described with reference to transistors M45-M48. However, note that the load resistors have been replaced with P-channel load transistors M55 and M56. The gates of transistors M55 and M56 also receive the $VR_{CTRL}$ voltage control signal. In FIG. 20, the main cell 2002 is biased with current sources $N*I_M$ and $I_M$ and the replica cell 2004 is biased with the $N*I_R$ and $I_R$ current sources. The loop gain, shifting, and set-up point circuit 2006 approximately corresponds to the circuits shown as amplifiers 1802 and 1804 in FIG. 18. Circuit 2006 includes a differential pair of transistors M49 and M50 biased with the $I_L$ current source. A current mirror including P-channel transistors M53 and M54 is coupled to the drains of transistors M49 and M50. The gates of all of the P-channel transistors are coupled together and to the $C_{COMP}$ capacitor for providing the $VR_{CTRL}$ control voltage signal. Transistor M51 has a drain coupled to the power supply rail, a gate coupled to the drains of transistors M46 and M48, and a source coupled to the gate of transistor M49 biased by a first $I_F$ current source. Transistor M52 has a drain coupled to the power supply rail, a gate coupled to the drains of transistors M45 and M47, and a source coupled to the gate of transistor M50 biased by a second $I_F$ current source. Note however, that a trim resistor $R_{TRIM}$ is coupled between the source of transistor M52 and the second $I_F$ current source. Trim resistor $R_{TRIM}$ is used to precisely control the peak amplitude of the wanted cubic pre-distortion signal at the output of the main cell 2002. In fact, when the loop is closed and has stabilized, due to the high gain of stage 2006 it will have forced the gates of M49, M50 to be almost identical. Were $R_{TRIM}$ not in place, this would translate into the equalization of the single-ended outputs of the replica cell 2004, i.e. a zero differential output imparted by the loop on the pre-distortion cell 2000. With the reference ohmic drop $R_{TRIM} \cdot I_F$ in place instead, the loop forces an identical $R_{TRIM} \cdot I_F$ voltage difference across the gates of M51 and M52, precisely setting the desired amplitude of the cubic correction corresponding to the maximum peak of the input signal ($V_{IN+PEAK} - V_{IN-PEAK}$ at the input of 2004 in FIG. 20).

Again, although the loop's set point as established via $R_{trim}$ directly influences the differential $V_{out\,peak}$ value, it cannot be used to scale directly the amplitude of the third-order curve correction, which requires either a non-linear trim of $R_{trim}$ or other external scaling of the $V_{out}$ signal in order to be effected. In this case, $R_{trim} \cdot I_F = \Delta V_{peak}$ defines the amplitude at the symmetrical extremes of the cubic curve before the interpolating linear term is purged, in the case of zero-end corrected INL calculation method.

It will be apparent to those skilled in the art that all of the characteristics useful to effect an odd-order correction ($3^{rd}$, $5^{th}$, 7th and so on) require pre-distortion shapes of the cubic kind, whose peaks are only indirectly related to the magnitude of the needed correction—at least in the paradigm of an INL calculated by using the zero-end corrected algorithm. In other words, for odd-order correction curves, a control loop regulating the maximum amplitude constitutes a suitable control parameter to execute a cancellation of the HD3, HD5, HD7, . . . HD(2n+1) distortion harmonics: but not the only parameter needed. Additional amplitude loops engineered to control the correction's signal amplitude at intermediate values of the input voltage between 0 and $V_{IN}$ max can usefully be employed, and their outputs combined towards the optimal cancellation of higher-order distortion products.

Figure 21:
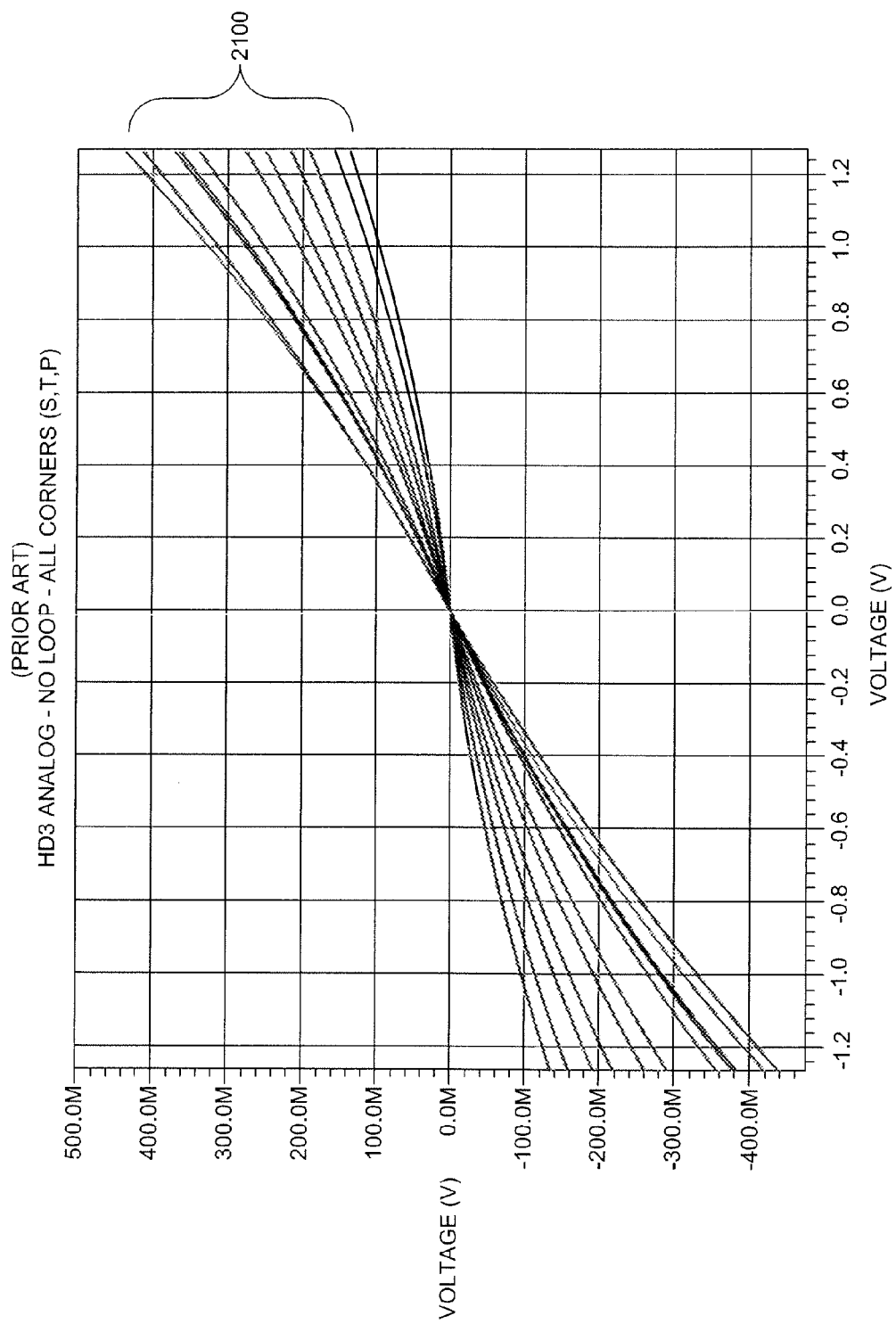
FIGS. 21-23 are plots of the open-loop (non-stabilized) performance of a pre-distortion circuit with respect to temperature and process corners (21, 22), and temperature only (23)
Figure 22:
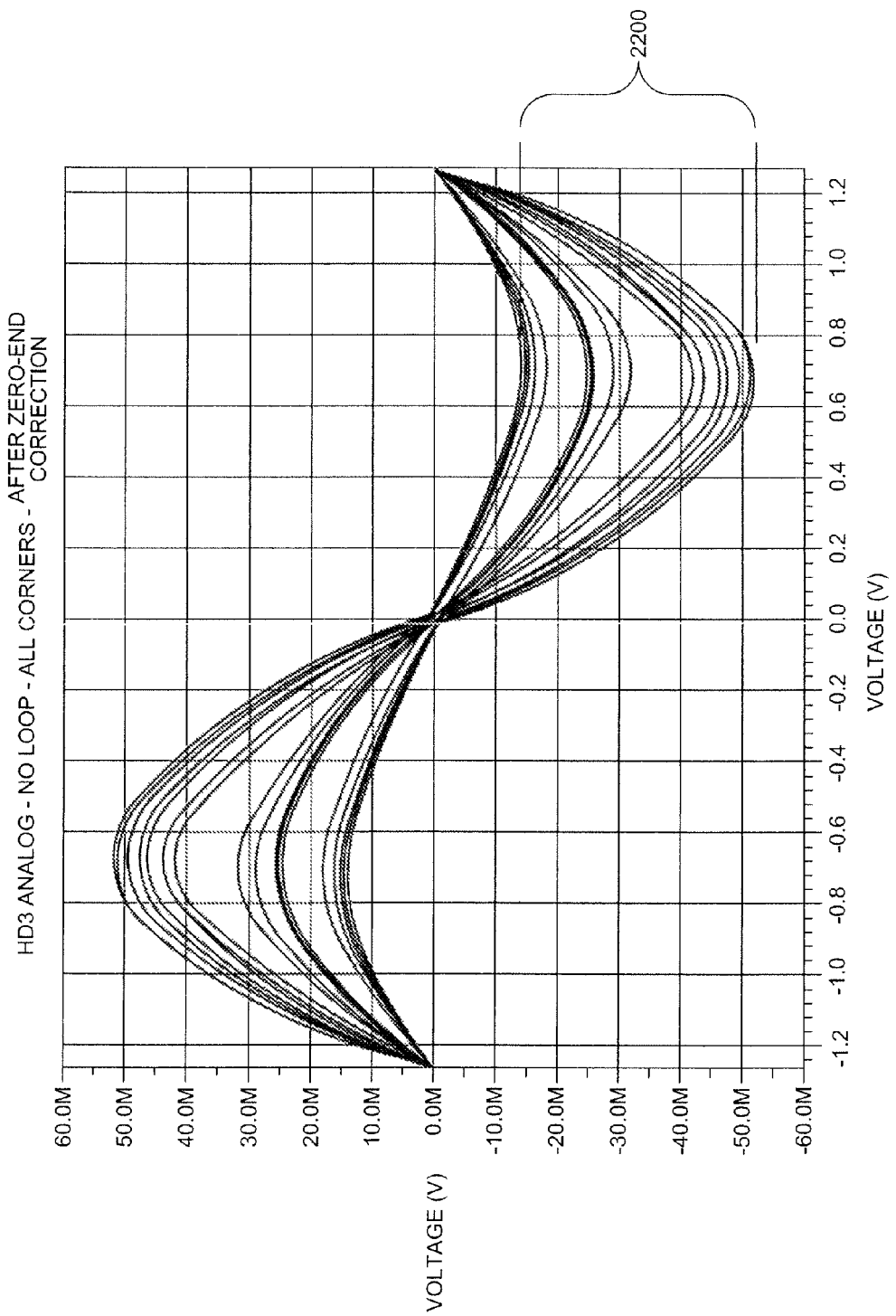
Figure 23:
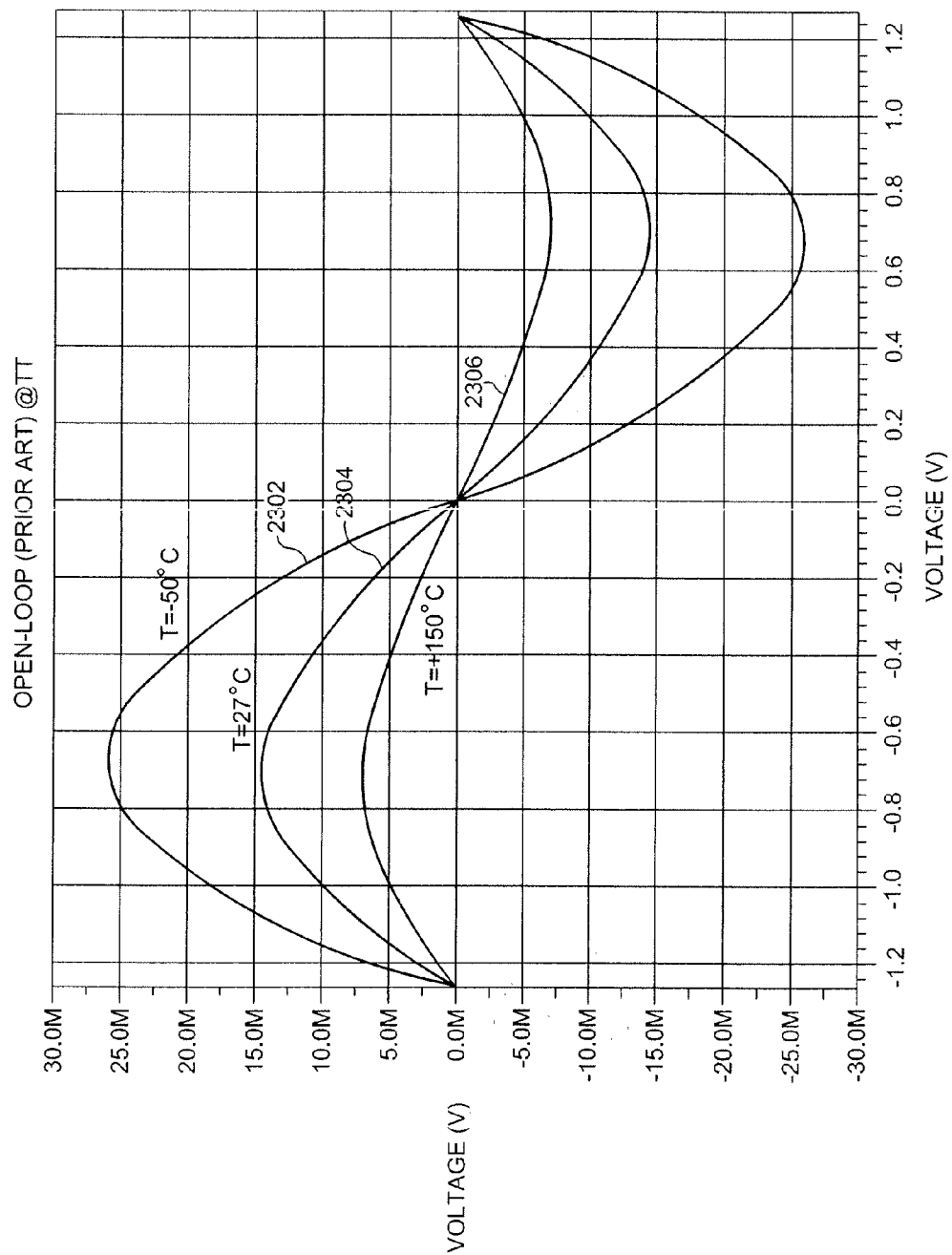
Figure 24:
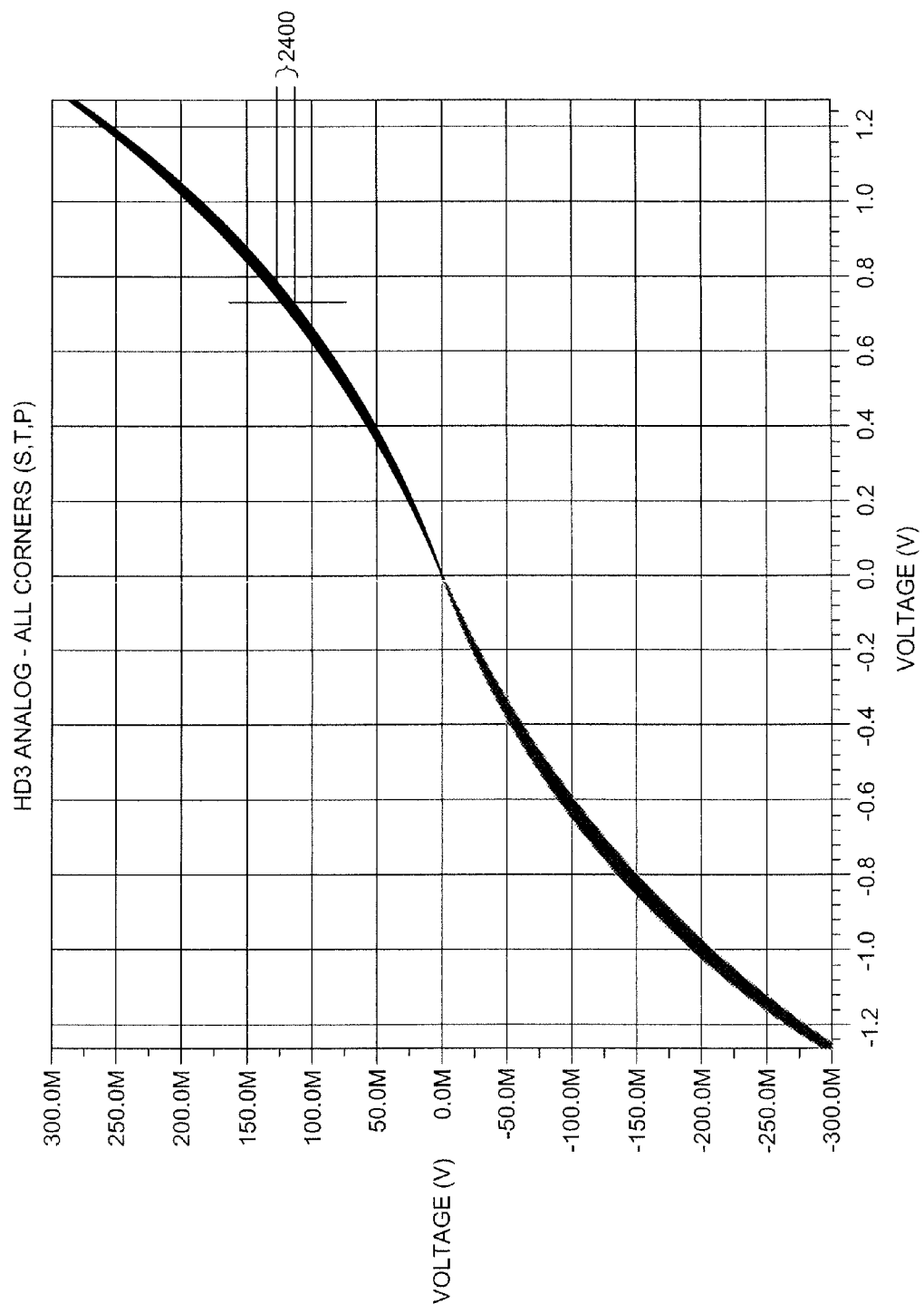
FIGS. 24-26 are corresponding plots of the closed-loop (stabilized) performance of a pre-distortion circuit with respect to temperature and process corners (24, 25), and temperature only (26) according to an embodiment of the present invention.
Figure 25:
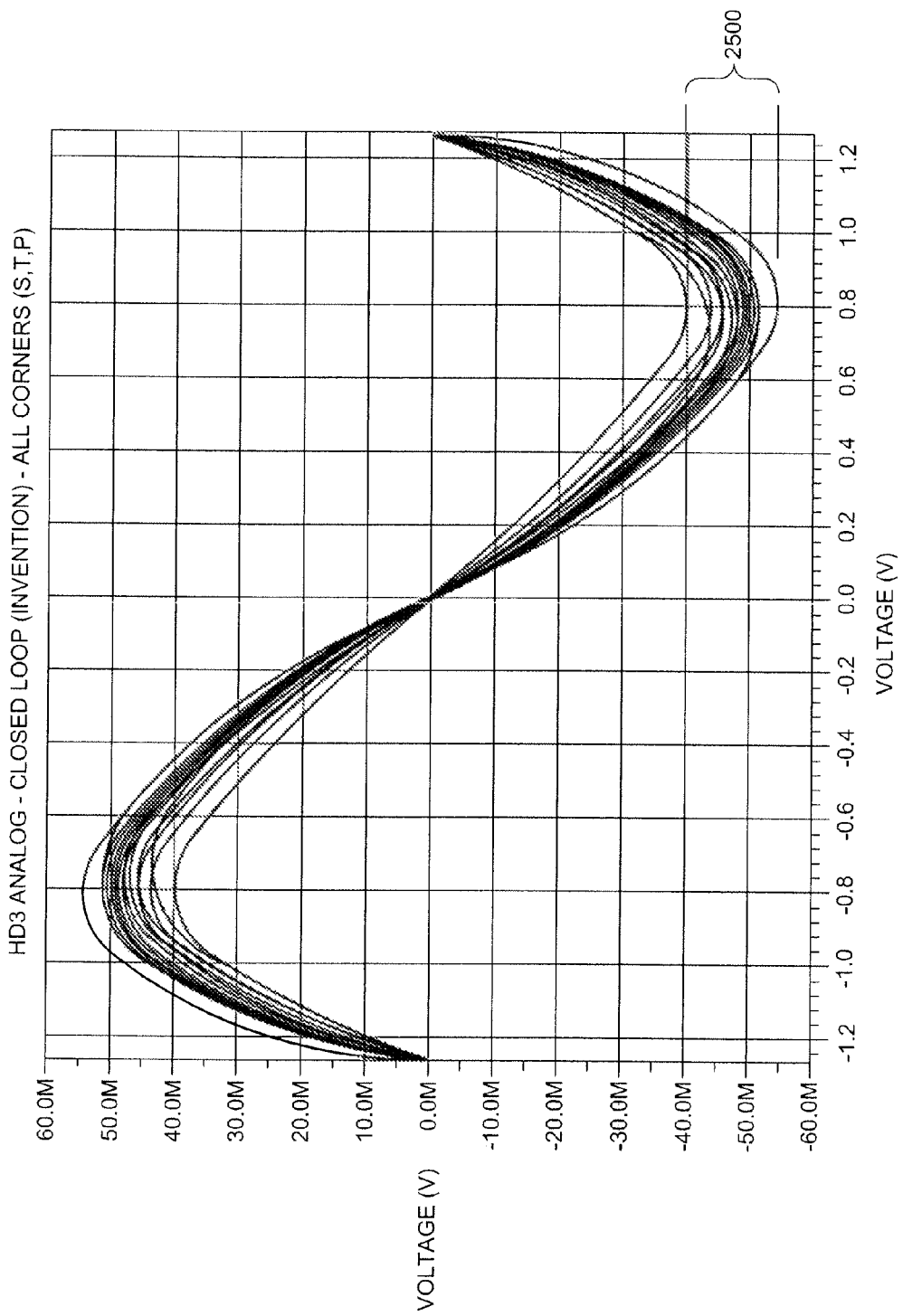
Figure 26:
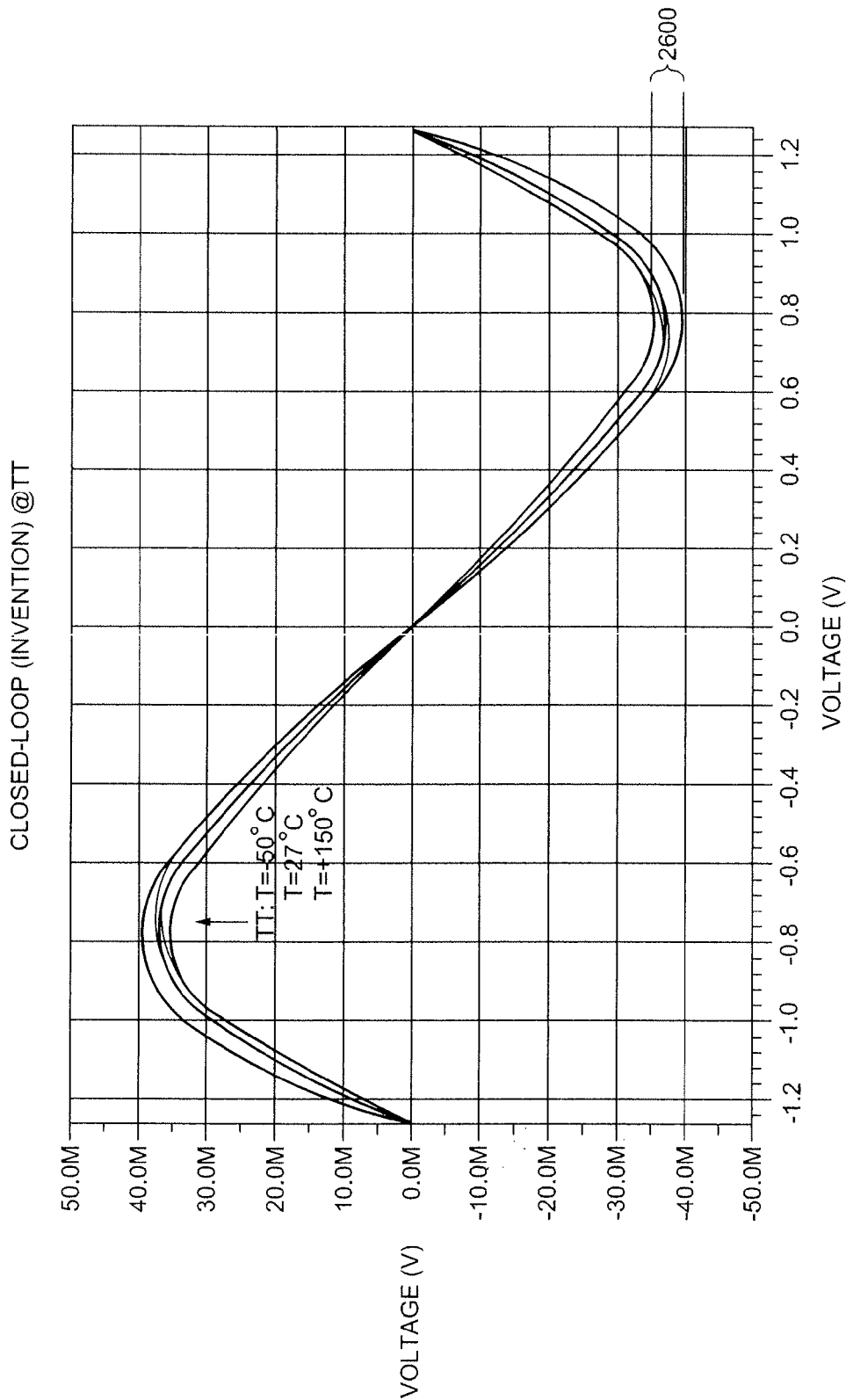

FIGS. 21-26 are simulation graphs that illustrate the improvement in performance that can be realized by implementing the circuit of the present invention. FIG. 21 is a simulation graph of the output voltage of cell 2002 of FIG. 20 in open loop with full-swing input, which synthesizes a cubic curve. Notice how the transfer characteristic 2100 changes dramatically with temperature and process corners. FIG. 22 is derived from FIG. 21 after zero-end correction, and represents an INL-like simulation graph of the transfer characteristics of the open loop third-order predistortion circuit. Again, note that the S-shape of the transfer curve 2200 changes dramatically with temperature and process corners. Referring now to the more detailed FIG. 23 where only temperature is swept and the process corner is kept typical, trace 2302 is the transfer curve simulated at −50° C., trace 2304 is the transfer curve simulated at 27° C., and trace 2306 is the transfer curve simulated at 150° C. FIGS. 24-26 are closed-loop equivalents of the open-loop characteristics shown in FIGS. 21-23. FIG. 24 (corresponding to FIG. 21) is a simulation graph of the transfer characteristics of a closed loop third-order predistortion circuit according to the present invention before any zero-end correction is effected. In particular, note that the cubic shape of the transfer curve 2400 barely changes with temperature. Similarly, note the tight grouping of the traces 2500 in FIG. 25 (corresponding to FIG. 22 and derived from FIG. 24 after zero-end correction) with respect to temperature and process corners: at the same time, notice how relieving the hard constraint at the curve's ends ($V_{IN}=+/-1.25V$ in figure) to introduce another controlled amplitude constraint e.g. at half-scale ($V_{IN}=+/-0.6V$ or similar, in figure) would help pack together the curves to an even larger extent. Referring to FIG. 26 finally, the detail of the temperature-only variations in the case of typical process corner is highlighted.

As previously described, the present invention can be extended if desired to higher order even and odd amplitude-stabilized predistortion circuits. Block diagrams are described below for implementing the higher-order predistortion circuits according to the present invention.

Figure 27:
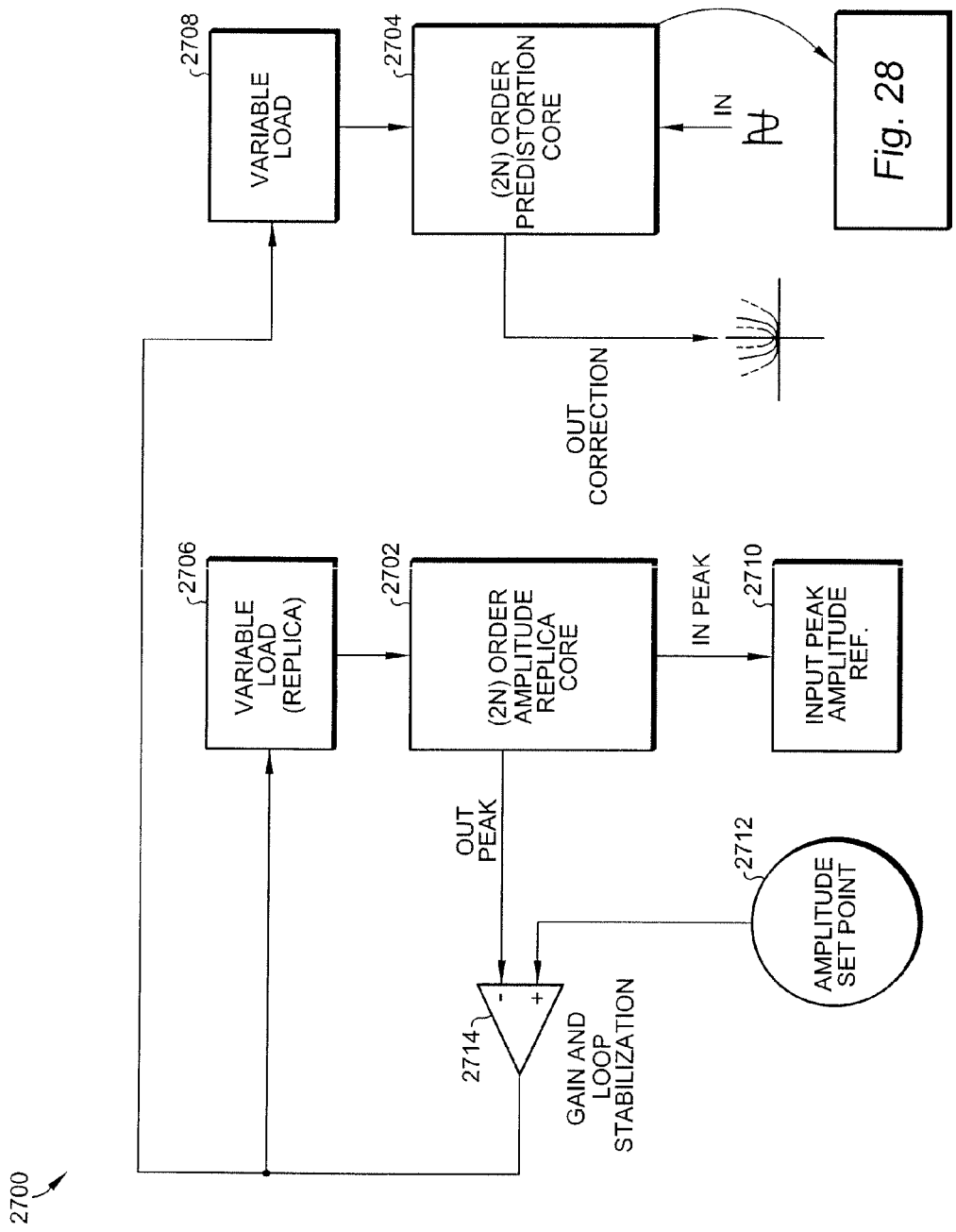
FIGS. 27 and 28 are block diagrams of a generalized (2N) even-order pre-distortion circuit according to the present invention.

FIG. 27 is a block diagram of a generalized (2N) even-order pre-distortion circuit 2700 according to the present invention. Amplitude-stabilized even-order predistortion circuit 2700 includes a first even-order predistortion circuit 2704 having an input for receiving an input signal, an output for providing a correction output signal, and a variable load 2708; a second replica even-order predistortion circuit 2702 having an input for receiving a peak input level (synthesized by a reference generating block 2710), an output for providing a correction peak output level, and a variable load 2706; and a gain and loop stabilization circuit 2714 having a first input for receiving the correction peak output signal, a second input for receiving a correction amplitude set point 2712, and an output coupled to the variable loads 2708 and 2706 of the first and second even-order predistortion circuits 2704 and 2706. As previously discussed, the variable loads 2706 and 2708 of the first and second even-order predistortion circuits 2704 and 2702 can include an active load formed using P-channel transistors. The gain and loop stabilization circuit 2714 can include one or more differential amplifiers as discussed above.

Figure 28:
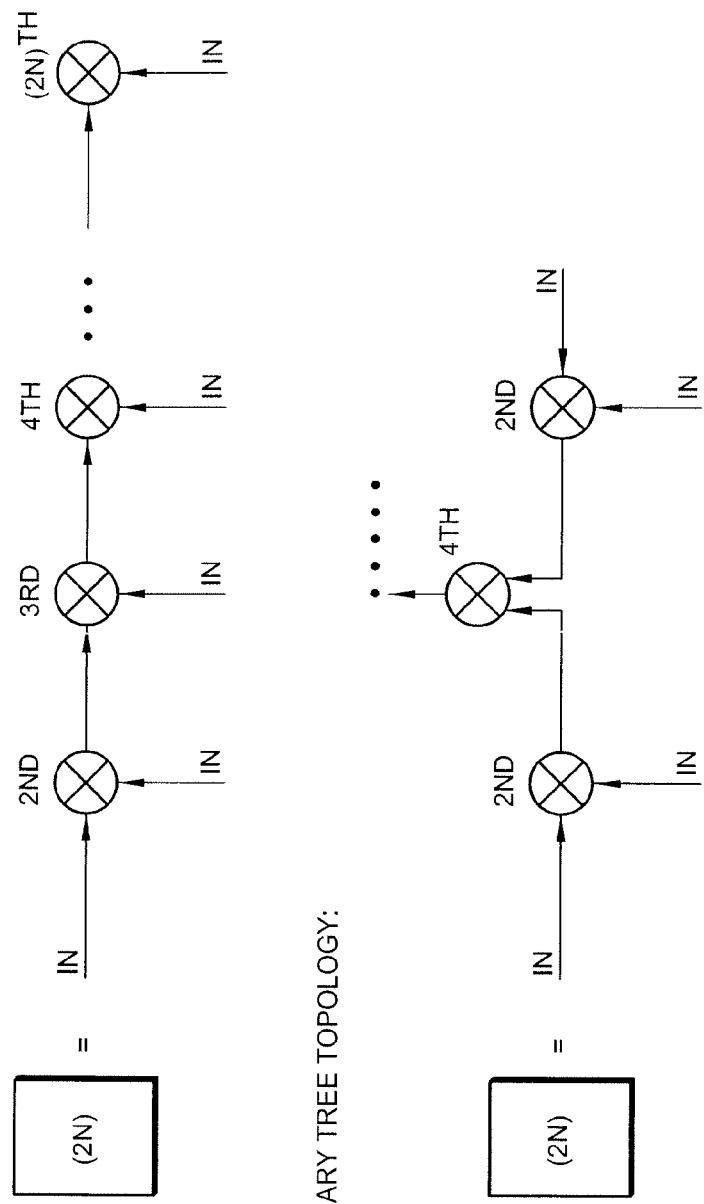

Referring now to FIG. 28, the first even-order predistortion circuit 2704 and the second replica even-order predistortion circuit 2702 can be formed using a cascade of a plurality of multiplier cells, or a plurality of multiplier cell coupled according to a binary tree topology.

Figure 29:
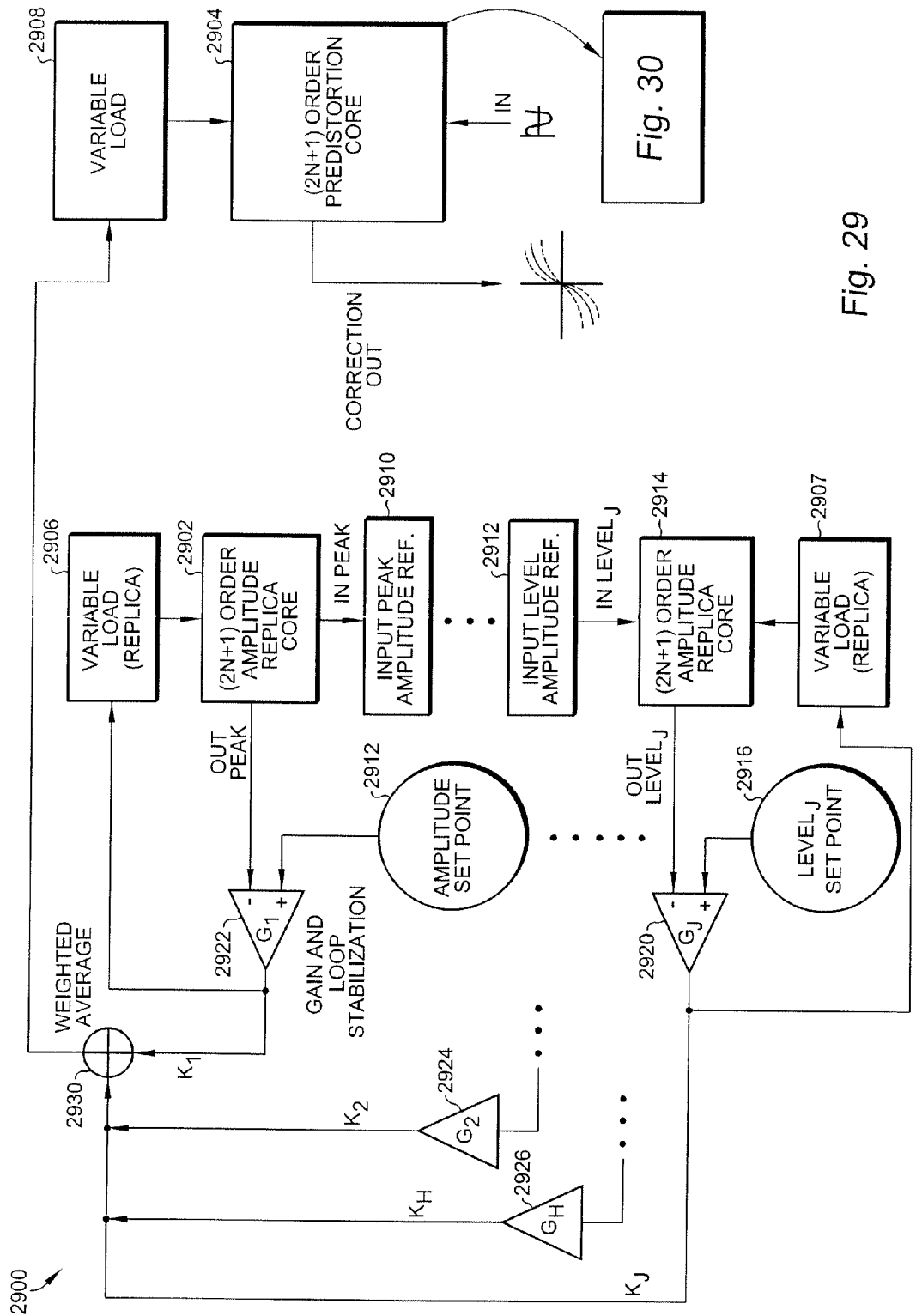

FIG. 29 is a block diagram of a generalized (2N+1) odd-order pre-distortion circuit according to the present invention. Amplitude-stabilized odd-order predistortion circuit 2900 includes a first odd-order predistortion circuit 2904 having an input for receiving an input signal, an output for providing a correction output signal, and a variable load 2908; a plurality of replica second odd-order predistortion circuits 2902 . . . 2914 each having an input for receiving a peak input level 2910 . . . 2912, an output for providing a correction peak level, and a variable load 2906 . . . 2907, and a plurality of gain and loop stabilization circuits 2920, 2922, 2924 . . . 2926 each having a first input for receiving the correction peak output level, a second input for receiving a correction amplitude desired set point 2916 . . . 2918, and an output for driving the respective variable load control inputs of the second replica odd-order predistortion circuits 2906 . . . 2907, as well as (with relative weights $K_1, K_2, K_H \ldots K_J$) the inputs of a signal combiner 2930 driving the variable load 2908 of the main odd-order predistortion circuit. As previously discussed, the variable load of the first and of the plurality of the second replica odd-order predistortion circuits can include an active load formed with P-channel transistors. The plurality of the gain and loop stabilization circuits each can include one or more differential amplifiers. Also, the plurality of the gain and loop stabilization circuits each include a desired set-point for the correction amplitude level.

Referring now to FIG. 30, the first odd-order predistortion circuit and the plurality of the second odd-order predistortion circuits of circuit 2900 can include a cascade of a plurality of multiplier differential cells. Alternatively, not shown in FIG. 30, the first odd-order predistortion circuit and the plurality of second odd-order predistortion circuits can include a cascade of a plurality of multiplier and cross-coupled differential cells. Finally, the first odd-order predistortion circuit and the plurality of second odd-order predistortion circuits can also include a plurality of multiplier and cross-coupled differential cells coupled according to a binary tree topology.

It is to be understood that the above-described circuits, embodiments, and drawing figures are merely illustrative of the many possible specific embodiments that can be devised to represent applications of the principles of the present invention. Numerous and varied other arrangements can be devised in accordance with these principles by those skilled in the art without departing from the spirit and scope of the invention. For example, the exact details of the circuit topography, component values, power supply values, as well as other details may be obviously changed to meet the specifications of a particular application.

I claim:

1. An amplitude-stabilized second order predistortion circuit comprising:
   a main cell having a differential input for receiving a differential input voltage, a differential output for providing a differential output voltage, and a load control input for receiving a load control voltage;
   a replica cell having a differential input for receiving a differential peak input voltage, a differential output, and a load control input; and
   a control circuit coupled to the differential output of the replica cell and driving the load control inputs of the main cell and the replica cell,
   wherein the main cell comprises a variable load.

2. The circuit of claim 1 wherein the replica cell comprises a variable load.

3. The circuit of claim 1 wherein the main cell comprises a multiplier cell.

4. The circuit of claim 1 wherein the replica cell comprises a multiplier cell.

5. The circuit of claim 1 wherein the control circuit comprises a first amplifier for generating a single-ended peak signal and a second amplifier for generating the load control voltage from the difference between the first single-ended peak signal and a single-ended reference signal.

6. The circuit of claim 1 wherein the control circuit comprises a differential amplifier.

7. The circuit of claim 1 wherein the control circuit comprises:
   a first transistor having a control terminal, and coupled to a first current source at a first intermediate terminal;
   a second transistor having a control terminal, and coupled to a second current source at a second intermediate terminal; and
   a differential amplifier coupled to the first and second intermediate terminals for generating the load control voltage.

8. The circuit of claim 7 further comprising a sub-circuit interposed between the second transistor and the second current source to generate an adjustable voltage drop.

9. The circuit of claim 8 where the sub-circuit interposed between the second transistor and the second current source is a variable resistor device.

10. An amplitude-stabilized second order predistortion circuit comprising:
    a first second-order predistortion circuit having an input for receiving an input signal, an output for providing a correction output signal, and a variable load;
    a second second-order predistortion circuit having an input for receiving a peak input signal, an output for providing a correction peak output signal, and a variable load; and
    a gain and loop stabilization circuit having a first input for receiving the correction peak output signal, a second input for receiving a correction amplitude set point, and an output coupled to the variable load of the first and second second-order predistortion circuits.

11. The circuit of claim 10 wherein the variable load of the first and second-order predistortion circuits comprises an active load.

12. The circuit of claim 10 wherein the first second-order predistortion circuit comprises a multiplier cell.

13. The circuit of claim 10 wherein the second second-order predistortion circuit comprises a multiplier cell.

14. The circuit of claim 10 wherein the gain and loop stabilization circuit comprises a differential amplifier.

15. An amplitude-stabilized even order predistortion circuit comprising:
    a first even-order predistortion circuit having an input for receiving an input signal, an output for providing a correction output signal, and a variable load;
    a second even-order predistortion circuit having an input for receiving a peak input signal, an output for providing a correction peak output signal, and a variable load; and
    a gain and loop stabilization circuit having a first input for receiving the correction peak output signal, a second input for receiving a correction amplitude set point, and an output coupled to the variable load of the first and second even-order predistortion circuits.

16. The circuit of claim 15 wherein the variable load of the first and second even-order predistortion circuits comprises an active load.

17. The circuit of claim 15 wherein the first even-order predistortion circuit and the second even-order predistortion circuit comprise a cascade of a plurality of multiplier cells.

18. The circuit of claim 15 wherein the first even-order predistortion circuit and the second even-order predistortion circuit comprise a plurality of multiplier cell coupled according to a binary tree topology.

19. The circuit of claim 15 wherein the gain and loop stabilization circuit comprises a differential amplifier.

* * * * *